US010997329B2

(12) United States Patent
Freeman et al.

(10) Patent No.: US 10,997,329 B2
(45) Date of Patent: May 4, 2021

(54) MOTION SENSING WI-FI SENSOR NETWORKS FOR CONTINUOUS 3D MODELING AND PREDICTION OF FACILITY RESPONSES TO DISTURBANCES

(71) Applicants: Massachusetts Institute of Technology, Cambridge, MA (US); Shell Oil Company, Houston, TX (US)

(72) Inventors: William T. Freeman, Acton, MA (US); Oral Buyukozturk, Chestnut Hill, MA (US); John W. Fisher, III, Chestnut Hill, MA (US); Frederic Durand, Somerville, MA (US); Hossein Mobahi, Saugus, MA (US); Neal Wadhwa, Cambridge, MA (US); Zoran Dzunic, Cambridge, MA (US); Justin G. Chen, Lexington, MA (US); James Long, Cambridge, MA (US); Reza Mohammadi Ghazi, Cambridge, MA (US); Theodericus Johannes Henricus Smit, Hillegom (NL); Sergio Daniel Kapusta, Houston, TX (US)

(73) Assignees: Massachusetts Institute of Technology, Cambridge, MA (US); Shell Oil Company, Houston, TX (US)

( * ) Notice: Subject to any disclaimer, the term of this patent is extended or adjusted under 35 U.S.C. 154(b) by 703 days.

(21) Appl. No.: 15/012,463

(22) Filed: Feb. 1, 2016

(65) Prior Publication Data
US 2017/0220718 A1    Aug. 3, 2017

(51) Int. Cl.
*G06F 30/23*     (2020.01)
*G01M 5/00*     (2006.01)
(Continued)

(52) U.S. Cl.
CPC ............... *G06F 30/23* (2020.01); *G01H 1/00* (2013.01); *G01M 5/0033* (2013.01);
(Continued)

(58) Field of Classification Search
CPC ....... G06F 17/5018; G06F 30/23; G01H 1/00; G01M 5/0033; G01M 5/0066; G06N 99/005; G06N 20/00; H04N 7/181
See application file for complete search history.

(56) References Cited

U.S. PATENT DOCUMENTS

| 2010/0215212 A1 | 8/2010 | Flakes, Jr. |
| 2011/0202289 A1 | 8/2011 | Kalantari |
| 2014/0100832 A1* | 4/2014 | Pado ................... G01M 5/0033 703/6 |

FOREIGN PATENT DOCUMENTS

| WO | WO 2001/39253 | 5/2001 |
| WO | WO 2016/012372 | 1/2016 |

OTHER PUBLICATIONS

Chintalapudi, Krishna, Erik A. Johnson, and Ramesh Govindan. "Structural damage detection using wireless sensor-actuator networks." Intelligent Control, 2005. Proceedings of the 2005 IEEE International Symposium on, Mediterrean Conference on Control and Automation. IEEE, 2005. (Year: 2005).*

(Continued)

*Primary Examiner* — Omar F Fernandez Rivas
*Assistant Examiner* — Joshua E. Jensen
(74) *Attorney, Agent, or Firm* — Hamilton, Brook, Smith & Reynolds, P.C.

(57) ABSTRACT

Structural health monitoring (SHM) is essential but can be expensive to perform. In an embodiment, a method includes sensing vibrations at a plurality of locations of a structure by a plurality of time-synchronized sensors. The method further includes determining a first set of dependencies of all sensors of the time-synchronized sensors at a first sample
(Continued)

time to any sensors of a second sample time, and determining a second set of dependencies of all sensors of the time-synchronized sensors at the second sample time to any sensors of a third sample time. The second sample time is later than the first sample time, and the third sample time is later than the second sample time. The method then determines whether the structure has changed if the first set of dependencies is different from the second set of dependencies. Therefore, automated SHM can ensure safety at a lower cost to building owners.

20 Claims, 13 Drawing Sheets
(5 of 13 Drawing Sheet(s) Filed in Color)

(51) Int. Cl.
 *G01H 1/00* (2006.01)
 *H04N 7/18* (2006.01)
 *G06N 20/00* (2019.01)
(52) U.S. Cl.
 CPC .......... *G01M 5/0066* (2013.01); *G06N 20/00* (2019.01); *H04N 7/181* (2013.01)

(56) References Cited

OTHER PUBLICATIONS

Sazonov, Edward, Kerop Janoyan, and Ratan Jha. "Wireless intelligent sensor network for autonomous structural health monitoring ." Smart Structures and Materials 2004: Smart Sensor Technology and Measurement Systems. vol. 5384. International Society for Optics and Photonics, 2004. (Year: 2004).*

Chen, Justin G., et al. "Structural modal identification through high speed camera video: Motion magnification." Topics in Modal Analysis I, vol. 7. Springer, Cham, 2014. 191-197. (Year: 2014).*
Albarbar, Alhussein, et al. "Suitability of MEMS accelerometers for condition monitoring: An experimental study." Sensors 8.2 (2008): 784-799. (Year: 2008).*
Silva, Agnelo, Mingyan Liu, and Mahta Moghaddam. "Power-management techniques for wireless sensor networks and similar low-power communication devices based on nonrechargeable batteries." Journal of Computer Networks and Communications 2012 (2012). (Year: 2012).*
Vanik, Michael W., James L. Beck, and Siu-Kui Au. "Bayesian probabilistic approach to structural health monitoring." Journal of Engineering Mechanics 126.7 (2000): 738-745. (Year: 2000).*
Zheng, Yixin, et al. "Understanding environmental effect on building vibration for structural health monitoring using event detection and causal analysis." International Workshop on Structural Health Monitoring 2013 A Roadmap to Intelligent Structures. 2013. (Year: 2013).*
Dzunic, Zoran, et al. "A Bayesian State-space Approach for Damage Detection and Classification." (Year: 2014).*
Caicedo, Juan & Pakzad, Shamim. (2015). Dynamics of Civil Structures, vol. 2: Proceedings of the 33rd IMAC, A Conference and Exposition on Structural Dynamics, 2015. 10.1007/978-3-319-15248-6. (Year: 2015).*
Dzunic, Zoran, et al. "A Bayesian state-space approach for damage detection and classification." Mechanical Systems and Signal Processing 96 (2017): 239-259. (Year: 2017).*
International Search Report and Written Opinion of PCT/US2017/015340 dated Jun. 7, 2017 entitled "Motion Sensing Wi-Fi Sensor Networks For Continuous 3D Modeling And Prediction Of Facility Responses To Disturbances".
International Preliminary Report on Patentability dated Aug. 7, 2018 titled "Motion Sensing Wi-Fi Sensor Networks For Continuous 3D Modeling and Prediction Of Facility Responses To Disturbances.".

\* cited by examiner

MOTION SENSING WI-FI SENSOR NETWORKS FOR CONTINUOUS 3D MODELING AND PREDICTION OF FACILITY RESPONSES TO DISTURBANCES

COMMON OWNERSHIP UNDER JOINT RESEARCH AGREEMENT 35 U.S.C. 102(C)

The subject matter disclosed in this application was developed, and the claimed invention was made by, or on behalf of, one or more parties to a joint Research Agreement that was in effect on or before the effective filing date of the claimed invention. The parties to the Joint Research Agreement are as follows Shell International Exploration & Production.

BACKGROUND

Structural inspection ensures the integrity of structures. Structural inspection includes informal subjective methods such as visual or hammer testing, and quantitative modern methods such as ultrasound, x-ray, and radar non-destructive testing techniques. These structural inspection methods are relatively intensive because they depend on the experience of the inspector and the time to inspect suspected damaged locations in the structure. Inspections are typically carried out periodically.

SUMMARY OF THE INVENTION

An embodiment of the present invention is a system and corresponding method that monitor structural health of buildings and structures, such as oilrigs, to detect and predict problems before significant damage occurs. Embodiments of the present invention include recent developments in low-power wireless sensing and machine learning methods. The system and method measure vibrations through sensors carefully located in the structure. Through a machine learning method, signals representing the vibrations are analyzed to detect deviation from normal behavior. The invention includes:
  a) a motion sensitive sensor network that continuously measures structural responses developed at various parts of the facilities (e.g., buildings, drilling platforms, etc.) due to external/internal disturbances (e.g., earthquakes, tides, engines, etc.), and
  b) a method that analyzes the data collected from the motion sensitive sensor network to build a graphical model between the nodes of the sensor network over different time steps, representative of the structure to detect if any damage or disturbances have occurred.

The system and method includes a variety of components, including low-power wireless sensors, methods to optimize sensor placement, and system and methods to perform structural modeling, and disturbance detection.

The system and method employ machine learning techniques to build a predictive 3D model of the responses of the various parts of the structure to continuous real 3D stresses. A dense grid of sensors further provides redundancy and a variety of collected data, aids noise suppression and provides a large data base for the machine learning techniques. This approach can provide more accurate information on facility integrity aspects than current technologies can provide. As such, this information can check the structural integrity and identifying problems in a timely fashion or in real-time. In fact, data bases of real 3D responses measured through continuous monitoring can be used to build accurate 3D models. The 3D models can then be used to predict, for example, catastrophic failures under extreme or long term loading conditions.

In an embodiment of the present invention, a damage detection process can be employed with a wireless sensor network for sensing damage and disturbances in various structures. The wireless sensor network hardware may be made smaller, ruggedized for outdoor use, rechargeable, and low power to enable multiyear battery operation.

The method can employ finite element model (FEM) building. Model parameters are first estimated by fitting the model to a set of small values of sensor measurements. The capability of the model to predict larger responses, which might arise due to higher magnitude disturbances, can then be assessed. From observing the sensor motions over time and under varying conditions, the FEM model is refined to fit best to the dynamic observations. Finally, the extrapolation capability of the model is assessed by testing on a small structure where a test catastrophic disturbance can be created.

The patterns in the 3D time-varying data collected by the sensors are learned and grouped according to a common set of features. The method separates noises from the actual structure responses, and also rigid motion from non-rigid motion components. The structural properties are inferred from dynamics of the groups over time.

Online prediction employs rapidly acquiring a learned model, and comparing the learned model with a real-time response of the structure. With the comparison, the method can identify parts of the structure where the motion, in selected modes or components, is larger than those in the model. An online method for the visualization of this 3D-sensor based motion magnification can be employed to assist alerting an operator of the system. Motion magnification is described further in Rubenstein et al., U.S. Pat. Pub. No. 2014/0072228, "Complex-Valued Eulerian Motion Modulation" (hereinafter "Rubenstein"), Wadhwa et al., U.S. Pat. Pub. No. 2014/0072229 "Complex-Valued Phase-Based Eulerian Motion Modulation" (hereinafter "Wadhwa"), and Wu et al., U.S. Pat. Pub. No. 2014/0072190, "Linear-Based Eulerian Motion Modulation" (hereinafter "Wu"), which are hereby incorporated by reference in their entirety.

Spectral analyses and system identification performed on a set of low-amplitude ambient data reveal distinct fundamental translational frequencies for the two major orthogonal axes (0.75 Hz NS, 0.67 Hz EW), a torsional frequency of 1.49 Hz, and a rocking frequency around EW axis of 0.75 Hz which is the same as the NS translational frequency. The two frequencies (e.g., NS translation and rocking around SW axis) being same clearly implies that motions in the NS direction are dominated by rocking motions with little or no bending contribution. In a test example, stiff shear walls at the east and west ends of the test building and weak geotechnical layers underlying its foundation provide for soil structure interaction in the form of rocking behavior around the east-west axis of the building. Clear evidence of such rocking behavior is rarely observed from low-amplitude data. In addition, a site frequency of 1.5 Hz is determined from a shear wave velocity versus depth profile obtained from a borehole in the vicinity of the building. While the translational frequencies of the building are not close to the site frequency, the torsional frequency is almost identical and may have contributed to resonant behavior during which the torsional frequency of the building is injected into the horizontal and vertical motions in the basement because of the rocking. In addition, the observation that the fundamental structural frequency in the NS direction (0.75 Hz) also appears in the vertical motions of the basement suggests that these spectral peaks reflect rocking motions of the building at this frequency.

Dynamic characteristics and deformation behavior of the building can be inferred from the measured real-time test data and compared with the response predictions from 3D Finite element modeling of the physical structural system. The data and the inferred dynamic behavior can be compared and correlated with the data from the existing wired accelerometers.

3D visualization can facilitate analysis of collected and inferred data. Based on 3D models of the structure, a system and method can provide a visualization of a unified environment having raw and processed data, and results of the various computational models. Visualizations can include standard color-coded approaches and re-rendering the motion with different types of magnification applied. Methods for real-time 3D pattern analysis of the sensor data can be employed, such as grouping patterns in the data, eliminating noise, clustering, and magnifying selective components of the motion such as rotations or translation.

Distributed sensing, for the purposes of infrastructure and environmental monitoring, can inferred in graphical models. Inference in graphical models provides a rigorous statistical framework for fusion and inference from multi-modal and spatially-distributed sensor data, and incorporates learning and non-Gaussianity. Importantly, graphical models make explicit the statistical relations between distributed measurements and structure phenomenon. The natural graphical model for a given physical model can contain loops (e.g. Markov Random Fields for spatial statistics) and that, as a consequence, exact inference is intractable, however estimates can be provided. Therefore, embodiments of the present invention employ approximate methods to infer in graphical models with provable performance guarantees. The resulting framework combines inference, information fusion, adaptation, and performance estimation in a computationally-tractable manner. Furthermore, the system and method can encode information at multiple levels and scales, resulting in architectures that incorporate both top-down (e.g., context and behavior) and bottom-up (e.g., features and sensors) information flows. These methods also integrate with the information planning methods described above in the resource constrained case. Given the staggering dimensionalism associated with practical proposed sensing problems, exploiting such structure to reduce complexity is essential to obtaining tractable methods, Finite Element Modeling (FEM), data Interpretation, and damage detection; Structural Health Monitoring (SHM).

The core knowledge of SHM is the interpretation of measurement. SHM investigates structural integrity, as related to the changes in structural properties (e.g., mass, stiffness, damping), through monitoring the changes in static and dynamic responses of the structure. Damage detection or damage identification is the kernel technique of SHM by providing the interpretation and explanation of the measurement with respect to the state of the structural health. Various damage detection methods are based on different physical and mechanical principles. Anomalies in stiffness, inertial characteristics, stress level, and damping level can be estimated based on the collected data by distributed sensor networks. In general, damage detection methods can be classified into two categories: (a) modal-based and (b) non-modal-based. Modal-based methods are derived from the formation of modal analysis in structural dynamics. The changes in structural properties are represented in terms of modal parameters by definition. Non-modal-based methods depict the change in structural properties in terms of structural response, such as inter-story drift.

As a basis for the evaluation of the structure, changes in the structural properties based on measured data are reconstructed first. Various modal-based methods relate the observed data to the structural properties. These methods are called modal parameter identification or realization methods such as direct and indirect time domain and frequency domain analysis methods.

One critical element for both environmental and infrastructure monitoring is the sensor localization problem. At large scales, precise knowledge of sensor placements is generally not feasible or is obtained at great cost. Current localization methods characterize the location and orientation of a sensor in the context of a physical sensing model combined with a distributed communication channel. Localization information is then obtained via a combination of common excitations via the physical sensing model, shared signals through the distributed communication channel, and a small number of calibrated sensor locations. Errors in position and orientation values can cause systematic biases in inference procedures, therefore sensor uncertainty is integrated directly into the inference formulation. Embodiments of the present invention, however, employ distributed sensor localization methods within the graphical model framework. These methods incorporate both non-Gaussian and non-linear models, and statistical machine learning methods for fitting to physical phenomenon.

In an embodiment, a method can include sensing vibrations at a plurality of locations of a structure by a plurality of time-synchronized sensors. The method can further include determining a first set of dependencies of all sensors of the time-synchronized sensors at a first sample time to any sensors of a second sample time, and determining a second set of dependencies of all sensors of the time-synchronized sensors at the second sample time to any sensors of a third sample time. The second sample time is later than the first sample time, and the third sample time is later than the second sample time. The method then determines whether the structure has changed if the first set of dependencies is different from the second set of dependencies.

In an embodiment, the method further includes executing an action at the structure if the structure has changed, wherein the action can be:
  a) providing an alert to an operator,
  b) providing an online alert;
  c) deactivating a feature of the structure;
  d) enable a high-sensitivity mode of the sensors or additional sensors to record vibration in the structure in further detail, or
  e) activating a safety feature of the structure.

In an embodiment, the time-synchronized sensors can be accelerometers. The time-synchronized sensors can also be a plurality of cameras detecting images at the plurality of locations of the structure, and the method can further sense the vibrations at the locations of the structure by performing motion magnification on the detected images by the plurality of cameras.

In an embodiment, determining whether the structure has changed includes generating a probability the structure has sustained damage.

In an embodiment, the method further includes connecting the plurality of time-synchronized sensors wirelessly.

In an embodiment, the time-synchronized sensors are configured to idle in a low-power mode, activate in a high-power mode, and then return to the low-power mode.

In an embodiment, the method further includes generating a numerical model of a configuration of the structure based on the first set of dependencies and second set of dependencies.

In an embodiment, the method further includes updating a first numerical model of a configuration of the structure based on the first set of dependencies and second set of dependencies to be a second numerical model. If the second numerical model is different from the numerical model, the method further determines that the structure has changed.

In an embodiment, a system can include time-synchronized sensors configured to sense vibrations at a plurality of locations of a structure. The system can also include a processor and a memory with computer code instructions stored therein. The memory operatively coupled to said processor such that the computer code instructions configure the processor to implement a graph generation module and a damage determination module. The graph generation module is configured to:

a) determine a first set of dependencies of all sensors of the time-synchronized sensors at a first sample time to any sensors of a second sample time, and
b) determine a second set of dependencies of all sensors of the time-synchronized sensors at the second sample time to any sensors of a third sample time.

The second sample time is later than the first sample time, and the third sample time is later than the second sample time.

The damage determination module is configured to determine whether the structure has changed if the first set of dependencies is different from the second set of dependencies.

A non-transitory computer-readable medium configured to store instructions for structural health monitoring (SHM), the instructions, when loaded and executed by a processor, causes the processor to, sense vibrations at a plurality of locations of a structure by a plurality of time-synchronized sensors. The instructions further cause the processor to determine a first set of dependencies of all sensors of the time-synchronized sensors at a first sample time to any sensors of a second sample time. The instructions further cause the processor to determine a second set of dependencies of all sensors of the time-synchronized sensors at the second sample time to any sensors of a third sample time. The second sample time is later than the first sample time, and the third sample time being later than the second sample time. The instructions further cause the processor to determine whether the structure has changed if the first set of dependencies is different from the second set of dependencies.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Figure 1A:
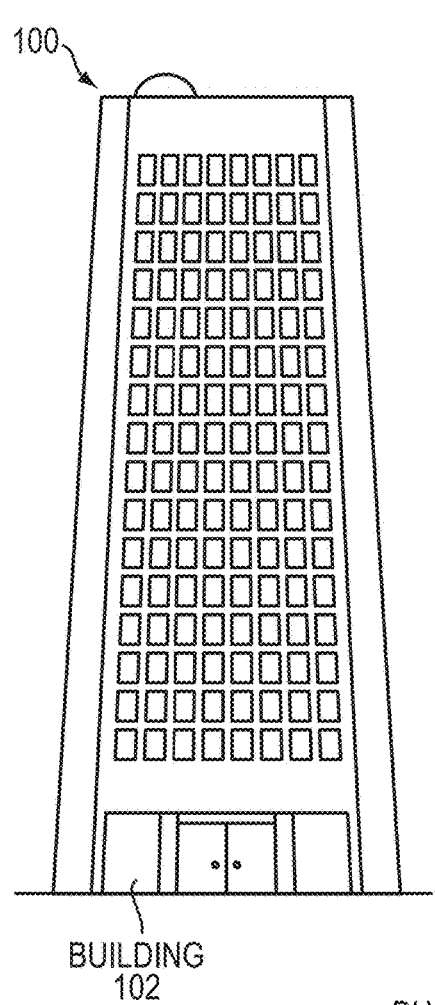
FIG. 1A is a diagram illustrating an example of a building equipped with a plurality of sensors for structural health monitoring.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Adding additional sensors to the structure, such that an indication of where potential locations of damage to the structure can be closely inspected, can be advantageous. These potential locations of damage can be useful for reduces the time and effort necessary for structural inspection.

Structural health monitoring (SHM) instruments a structure with sensors to collect data and derives some information from the collected data to determine whether the structure has changed. A detected change in the structure can then be attributed to damage that can be more closely investigated. In general, collected data is processed into features that may indicate these changes in the structure, and, in some cases, statistical or probabilistic discrimination of these features can separate data collected from intact and changed structures.

Statistical methods can discriminate feature changes as a result of structural changes from measurement or environmental variability. Bayesian inference is a probabilistic method of inference allowing formation of probabilistic estimates of certain parameters given a series of observations. SHM can employ Bayesian interference to update model(s) of structural parameters, monitor the structure by inferring structural parameters over time employed and determine the optimal placement of sensors. Bayesian inference can be employed in a model-based situation where a structural model is either formulated or updated as a basis for damage detection. Bayesian interference can also be employed in a data-based situation where there is no prior information on the structural model and only the sensor data is used. Bayesian inference can also be employed in a mixture of the model-based situation and dark-based situation.

A Bayesian switching dependence analysis under uncertainty can be applied to time-series data obtained from sensors, accelerometers, such as located at multiple positions on a building. This analysis generates a model that is effectively a computational representation of the physical structural system, and the act of collecting information on that system through the use of sensors. By accounting for interactions between sensor signals collected from the system in different locations, the system can infer a representation of the structural connections between locations in the structure or the underlying physics without have any knowledge of the actual structural configuration or dynamics. Assuming that the model learned from a set of data being exclusive to the corresponding physical structural configuration and condition, a change in the model parameters can indicate of a change in the measured physical structure, which may be caused by damage.

FIG. 1A is a diagram 100 illustrating an example of a building 102 equipped with a plurality of time-synchronized sensors for SHM.

Figure 1B:
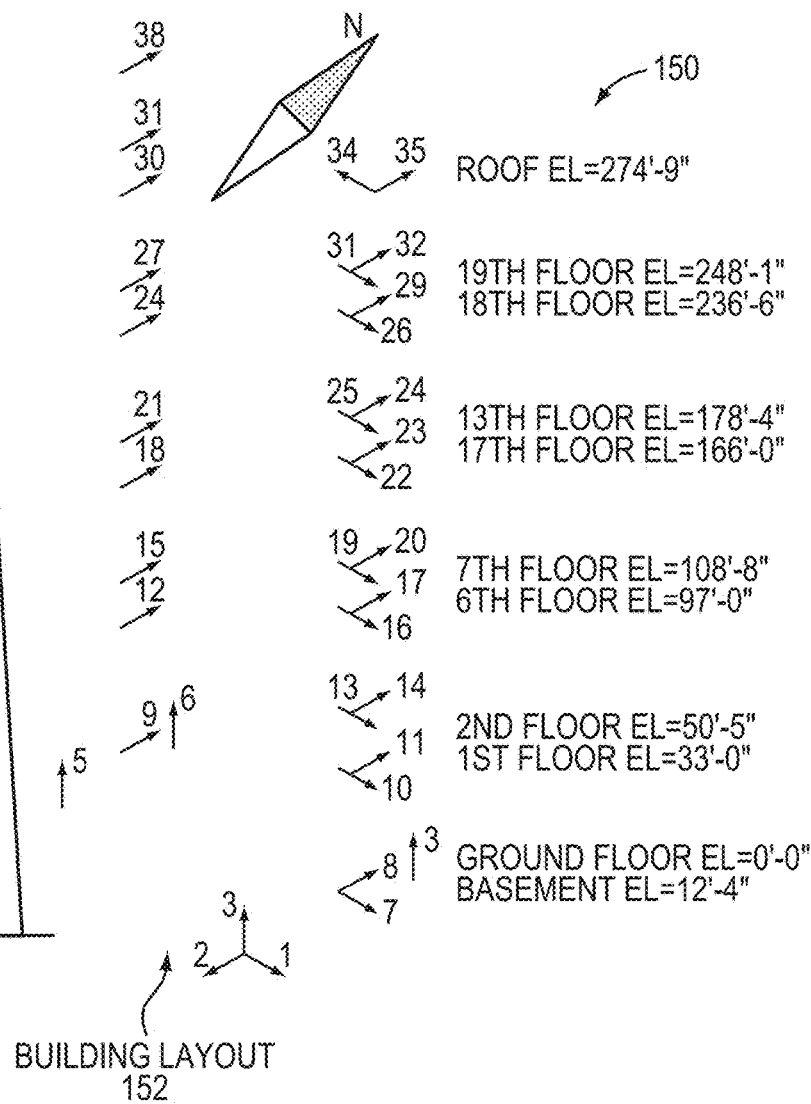
FIG. 1B is a diagram illustrating an example embodiment of a building layout of the building equipped with the plurality of sensors.

FIG. 1B is a diagram 150 illustrating an example embodiment of a building layout 152 of the building 102 equipped with the plurality of time-synchronized sensors 1-36. Each time-synchronized sensor 1-36 is in a particular location on a particular floor of the building 102. Each time-synchronized sensor 1-36 further has an orientation indicated by the arrow of the sensor in FIG. 1B. The time-synchronized sensors, as described herein, can be vibratory sensors, accelerometers, strain sensors, or cameras configured to monitor the structure visually, perform motion magnification, and determine vibration information from the motion magnification. Embodiments of applicant's system and method rely on non-destructive testing based on, for example, continuously collected vibrational data.

Further, the time-synchronized sensors 1-36 are configured to allow user configuration, such as specifying arbitrary data acquisition limitations that are then executed on each sensor device before the sensor's results are sent wirelessly. Each time-synchronized sensor 1-36 includes a microcontroller, sensor, and radio. The microcontroller in the time-synchronized sensors 1-36 provides application logic that allows for customization of data acquisition. Allowing such customization was not done previously because it requires more memory, however, but provides greater functionality.

Further, the time-synchronized sensors 1-36 are configured to run in a low power mode off a battery. The battery can further be supplemented with renewable energy sources such as solar, energy harvesting (piezoelectric), wind, and temperature differential. Further, the sensors can operate in low power modes and switch to high-power modes only when necessary, before switching back to the low power mode.

In an example testing environment, experimental test structures can be to further generate data to test the approach for application on a structure. For example, structures are made of modular elements that are based on steel columns that are 60 cm×5.08 cm×0.64 cm, and bolted together by 4 bolts at each connection as an example of a typical connection. The structures are bolted to a heavy concrete foundation as a reaction mass. They are instrumented with sensors, such as piezoelectric triaxial accelerometers, that have a sampling rate of 6000 Hz, and the number used differs for each structure. In an embodiment the sensors can be piezoelectric triaxial accelerometers that have a sampling rate of 6000 Hz.

Figure 1D:
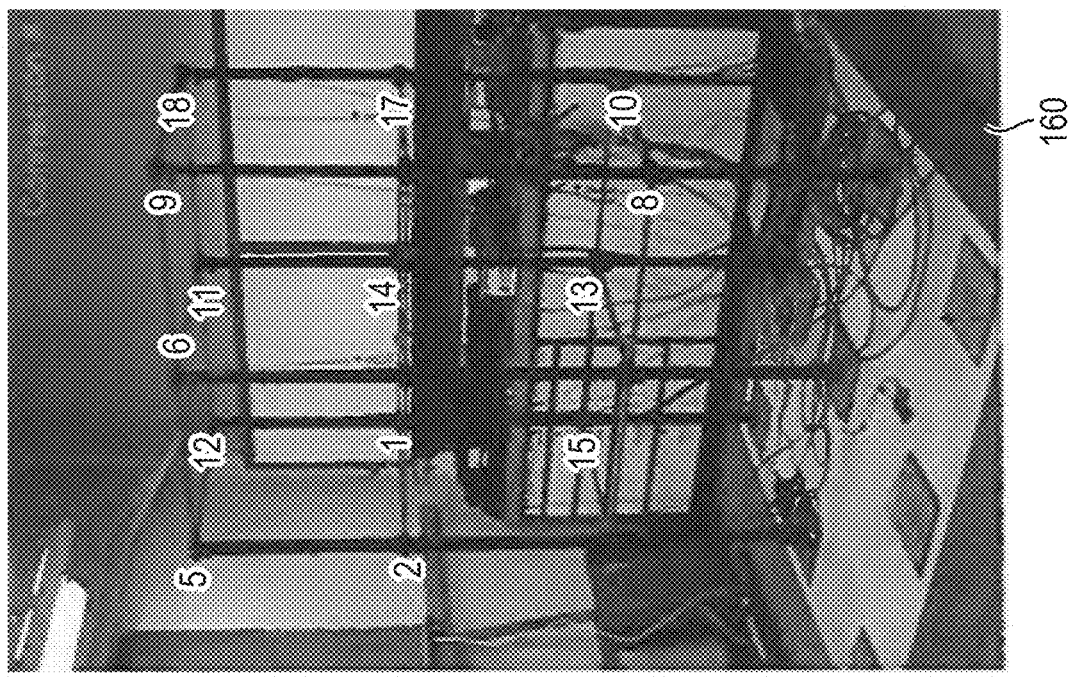
FIG. 1D is a diagram illustrating a second test structure having a three story two bay configuration with a footprint of 120 cm×60 cm.
Figure 1C:
FIG. 1C is a diagram illustrating a first testing structure having a steel beam.

FIG. 1C is a diagram 150 illustrating a first testing structure having a steel beam. In an embodiment, a first testing structure is a vertical cantilever beam including three steel column elements. For testing, damage can be introduced on one of the two middle bolted connections. In an example minor damage case, two of four bolts in the flexible direction are removed. In an example major damage case, four bolts are loosened to only be hand tight. The test structure is instrumented with four accelerometers, one at each connection of the steel columns, including the connection with the foundation, and at the top of the structure. The cantilever beam is displaced by approximately 5 cm to excite it, and then released and allowed to freely vibrate for 10 seconds. Data was collected during those 10 seconds. Ten test sequences for each damage scenario were run and are summarized in Tables 1A-B.

FIG. 1D is a diagram 160 illustrating a second test structure having a three story two bay configuration with a footprint of 120 cm×60 cm. The structure consists of steel columns and beam frames of similar dimensions for each story that are bolted together to form each story. Damage is similarly introduced on the bolted connections with the minor and major damage cases by removing two bolts or loosening all four at connections 1 and 17, which are on opposite corners of the structure, with connection 1 being on the first story, and connection 17 being on the second. This structure is instrumented with 18 triaxial accelerometers at each of the connections between elements. For this test structure, the excitation is a small shaker with a weight of 0.91 kg and a piston weight of 0.17 kg attached to the top corner of the structure at connection 18, which provided a random white Gaussian noise excitation in the frequency range of 5-350 Hz in the flexible direction. Test measurements lasted for 30 seconds, and the shaker excited the structure for the duration of the test measurement, thus there is no ramp up or unforced section of the data. The damage scenarios are summarized in Tables 1A and 1B. For each damage scenario, 10 sequences were acquired.

TABLE 1A

Column structure

| Test Case | Damage Scenario |
| --- | --- |
| 1 | Intact column |
| 2 | Minor damage, lower joint |
| 3 | Major damage, lower joint |

TABLE 1A-continued

Column structure

| Test Case | Damage Scenario |
|---|---|
| 4 | Minor damage, upper joint |
| 5 | Major damage, upper joint |

TABLE 1B

3-story, 2-Bay structure.

| Test Case | Damage Scenario |
|---|---|
| 1 | Intact column |
| 2 | Minor damage at 17 |
| 3 | Major damage at 17 |
| 4 | Minor damage at 1 |
| 5 | Major damage at 1 |
| 6 | Major damage at 1 and 17 |

In an embodiment, a modified state-space switching interaction model (SSIM) can be applied to classification of time-series of collected data.

Graphical models employ computational graphs (e.g., a computational graph data structure having nodes and edges connecting the nodes) to compactly represent families of joint probability distributions among multiple variables that respect certain constraints dictated by a graph. In particular, a Bayesian network (BN) can include (a) a directed acyclic graph G=(V,E), where nodes $X_1, X_2, \ldots, X_N$ represent random variables, and (b) a set of conditional distributions $p(X_i|pa(X_i))$, $i=1, \ldots, N$, where $pa(X_i)$ represent a set of variables that correspond to the parent nodes (parents) of node $X_i$. Heckerman. D, *A Tutorial on Learning With Bayesian Networks*, Tech Rep. MSR-TR-95-06, Microsoft Research, March 1995 (hereinafter "Heckerman") includes more information on BNs, and is herein incorporated by reference in its entirety. Dynamic Bayesian networks (DBNs) are Bayesian networks that model sequential data, such as time-series. Each signal in a model is represented by a sequence of random variables that correspond to its value at different indices, or discrete time points. In a DBN, edges are allowed only from a variable with a lower index to a variable with a higher index (e.g., they "point" forward in time in the time-series). Gahahramani, Z., *Learning Dynamic Bayesian Networks. Adaptive Processing of Sequences and Data Structures*, pp. 168-197, Springer 1998 (hereinafter "Gahahramani") includes more information on DBNs, and is herein incorporated by reference in its entirety.

Assume that N multivariate signals evolve, according to a Markov process, over discrete time points t=0, 1, ..., T. The value of signal i at time point t>0 depends on the value of a subset of signals pa(i,t) at time point t−1. The subset of signals to pa(i,t) is a parent set of signal i at time point t. While the preceding implies a first-order Markov process, the approach extends to higher-ordered Markov processes. A collection of directed edges $E_t=\{(v,i); i=1, \ldots, N, v \in pa(i,t)\}$ forms a dependence structure (or an interaction graph) at time point t, $G_t=(V,E_t)$ where V={1, ..., N} is the set of all signals. That is, there is an edge from j to i in $G_t$ if and only if signal i at time point t depends on signal j at time point t−1. $X_t^i$ denotes a (multivariate) random variable that describes the latent state associated with signal i at time point t. Then, signal i depends on its parents at time t according to a probabilistic model $p(X_t^i|X_{t-1}^{pa(i,t)},\theta_t^i)$ parameterized by $\theta_t^i$, where $X_{t-1}^{pa(i,t)}$ denotes a collection of variables $\{X_{t-1}^v;$ $v \in pa(i,t)\}$. Furthermore, signals are conditioned on their parents at the previous time point, and are further independent of each other:

$$p(X_t | X_{t-1}, E_t, \theta_t) = \prod_{i=1}^{N} p(X_t^i | X_{t-1}^{pa(i,t)}, \theta_t^i), \quad (1)$$

where $X_t=\{X_t^i\}_{i=1}^{N}$ (e.g., $X_t$ is a collection of variables of all signals at time point t) and $\theta_t=\{f_t^i\}_{i=1}^{N}$. Structure $E_t$ and parameters $\theta_t$ determine a dependence model at time t, $M_t=(E_t,\theta_t)$. Finally, a joint probability of all variables at all time points, X, is as expressed $$p(X) = p(X_0 | \theta_0) \prod_{t=1}^{T} p(X_t | X_{t-1}, E_t, \theta_t) = \quad (2)$$

$$\prod_{i=1}^{N} p(X_0^i | \theta_0^i) \prod_{t=1}^{T} \prod_{i=1}^{N} p(X_t^i | X_{t-1}^{pa(i,t)}, \theta_t^i).$$

Figure 2:
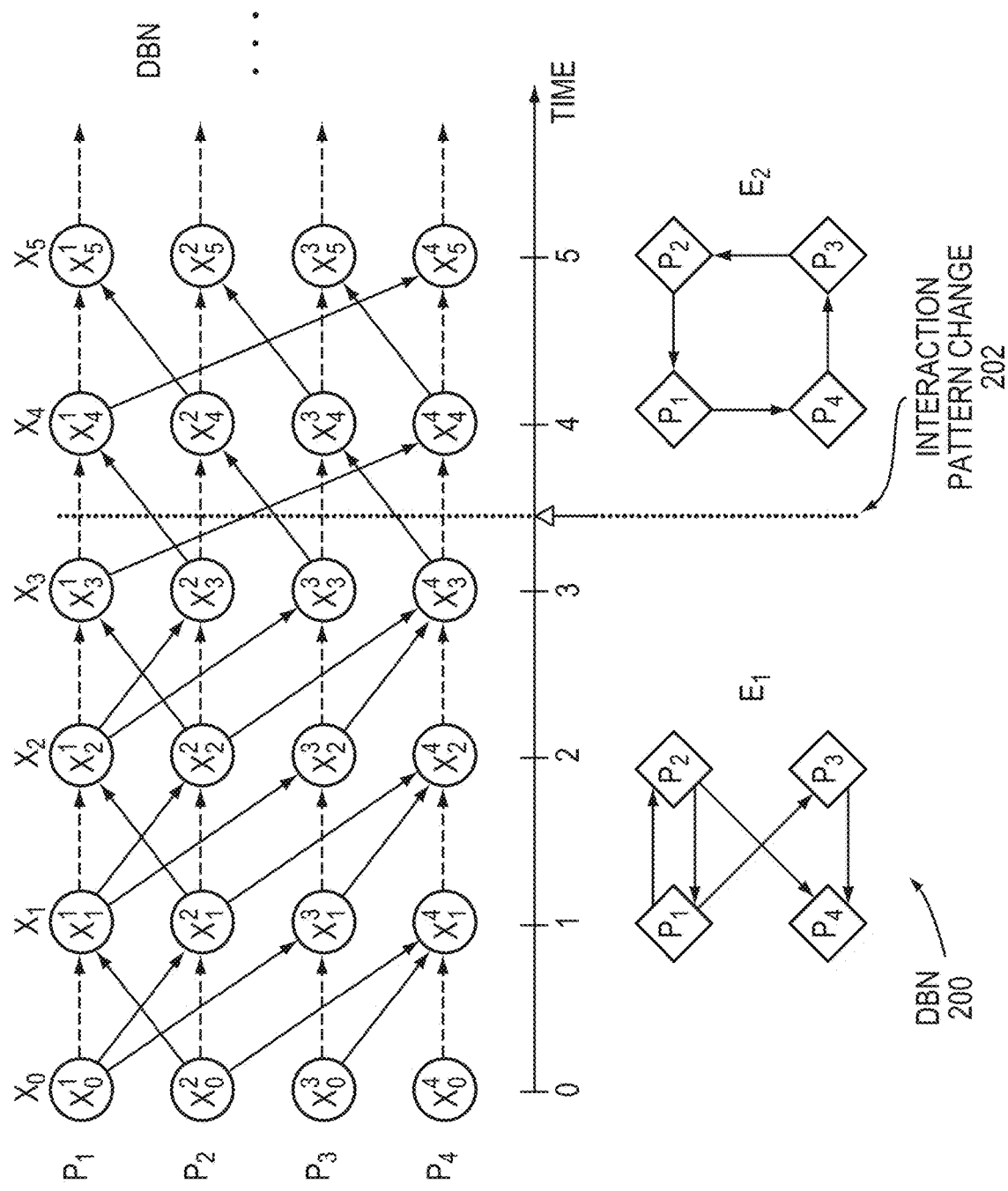
FIG. 2 is a diagram illustrating a DBN 200.

FIG. 2 is a diagram illustrating a DBN 200. The stochastic process of Eq. 2, above, can be represented using a DBN such as the DBN 200 of FIG. 2, such that there is a one-to-one correspondence between the DBN and the collection of interaction graphs over time. The DBN 200 illustrates a representation of switching interaction among four signals $P_1$, $P_2$, $P_3$, and $P_4$. The top portion of FIG. 2 illustrates the DBN at each time sample, for time t=[0, 1, 2, 3, 4, 5]. For example, $P_1$ represented values $x_0^1, x_1^1, x_2^1, x_3^1, x_4^1$, and $x_5^1$, corresponding to respective times t=[0, 1, 2, 3, 4, 5]. Accordingly, $P_2$ represents similar values $x_{ii}^2$, $P_3$ represents similar values $x_{jj}^3$, and $P_4$ represents similar values $x_{kk}^4$, where ii, jj, and kk are corresponding time values.

A person of ordinary skill in the art can recognize that the relationships between $P_1$-$P_4$ is the same at time points t=0, 1, 2, and 3, prior to an interaction pattern change 202. The DBN 200 illustrates dependencies between each sensed value x by the edges connecting a sensed value from one time to the subsequent time (e.g., from t=0 to t=1, t=1 to t=2, or t=2 to t=3). With the assumption that all nodes of the graph depend on each other (e.g., via the dotted lines), the analytical focus is on the non-self-edges in DBN 200. For example, from t=0 to t=1, $x_1^1$ depends on $x_0^2$, $x_1^2$ depends on $x_0^1$, $x_1^3$ depends on $x_0^1$, and $x_1^4$ depends on $x_0^2$ and $x_0^3$. Similarly, at the next time sample, from t=1 to t=2, $x_2^1$ depends on $x_1^2$, $x_2^2$ depends on $x_1^1$, $x_2^3$ depends on $x_1^1$, and $x_2^4$ depends on $x_1^2$ and $x_1^3$. The nodes, prior to the interaction pattern change 202, can be represented by interaction graph $E_1$, showing $P_1$ depending on $P_2$, $P_2$ depends on $P_1$, $P_3$ depends on $P_1$ and $P_4$ depends on $P_2$ and $P_3$.

After the interaction pattern change 202, the dependencies in the DBN 200 change. For example, from t=3 to t=4, $x_4^1$ depends on $x_3^2$, $x_4^2$ depends on $x_3^3$, $x_4^3$ depends on $x_3^4$, and $x_4^4$ depends on $x_1^3$. As represented by $E_2$, $P_1$ depends on $P_2$, $P_2$ depends on $P_3$, $P_3$ depends on $P_4$, and $P_4$ depends on $P_1$. Interaction graphs $E_1$ and $E_2$ are the set of directed lines representing temporal dependencies between the sensors. Once these temporal dependencies are modeled, any change at a time step is a result of a change to the system that physically connects the sensors, and therefore can indicate damage.

Further, the sensitivity of the DBN 200 and therefore interaction graphs $E_1$ and $E_2$ can be programmable, so that the user can determine the magnitude of a change that causes a responsive action by the system and method.

In relation to embodiments of the present invention, $P_1$, $P_2$, $P_3$, and $P_4$ represent datasets in the DBN 200 of FIG. 2 from different sensors deployed on the structure (e.g., the structure of FIG. 1A). A person of ordinary skill in the art can recognize that a different number of sensors and time samples can also be employed. In an embodiment, the sensors detect vibrations, represented by the measurements $x_0$-$x_5$ for each dataset $P_1$, $P_2$, $P_3$, and $P_4$. Based on the collected datasets, dependencies are calculated at each time interval. After a disruption to the building such as an earthquake, explosion, etc., damage may occur which affects the vibration data collected at each sensor. An example of damage to the building can be beams of a floor of the structure breaking, and therefore not carrying vibrations throughout the structure to other sensors in the same manner. Therefore, after the building structure has been changed/damaged at the time of interaction pattern change 202, the dependencies between the sensors change. This change in dependencies can trigger an alert to an operator or other action (e.g., shutting down a drill or other activity, activating sprinklers, triggering an evacuation, etc.) in the structure to respond to the damage.

Further, it is important to note that the dependencies in the DBN 200 are temporal and not spatial. A temporal dependence is a dependency based on each time step between each sensor. However, a spatial dependency is a dependency between sensors based on all time series at each particular sensor. Applicant's system and method does not employ spatial dependencies as described above.

Further, Applicant's system and method solves the unique challenge of determining a change to a physical structure based on a structure of a computational graph model. The computational graph model describes sensor data and uses that to make decisions about the physical structure. Further, prior graph data structures do not represent physical structures.

In one embodiment, data structures can be limited to fully-connected graphs, which can in some cases provide better results.

After data has been collected by the sensors, it must be analyzed to develop the DBN 200 as shown in FIG. 2. To learn time-varying interaction from time-series data, assume that the dependence model switches over time between K distinct models $\tilde{M}_k=(\tilde{E}_k,\tilde{\theta}_k)$, $k=1, \ldots, K$. More formally, for each time point t, $M_t=_k$ for some k, $1 \leq k \leq K$. One interaction may be active for some period of time, followed by a different interaction over another period of time, and so on, switching between a pool of possible interactions. Let $Z_t$, $1 \leq t \leq T$, be a discrete random variable that represents an index of a dependence model active at time point t; i.e., $M_t=_{Z_t}$, $Z_t \in \{1, \ldots, K\}$. The transition model of Equation 1 can be also expressed as:

$$p(X_t \mid X_{t-1}, Z_t, .) = p(X_t \mid X_{t-1}, Z_t, Z_t) = \prod_{i=1}^{N} p(X_t^i \mid X_{t-1}^{(i,Z_t)}, Z_t), \quad (3)$$

where $(\tilde{E}, \tilde{\theta})=\{(\tilde{E}_k, \tilde{\theta}_k)\}_{k=1}^{K}$ is a collection of all K models and $\tilde{pa}(i,k)$ is a parent set of signal i in $\tilde{E}_k$. Equation 2 can expressed as:

$$p(X|Z)=p(X_0|\theta_0)\Pi_{t=1}^{T}p(X_t|X_{t-1},Z_t,\tilde{E},\tilde{O}),$$

where $Z=\{Z_t\}_{t=1}^{T}$. To distinguish from signal state, $Z_t$ is defined as a switching state (at time t) and Z a switching sequence. Furthermore, Z forms a first order Markov chain:

$$p(Z) = p(Z_1)\prod_{t=2}^{T} p(Z_t \mid Z_{t-1}) = \pi_{Z_1}\prod_{t=2}^{T} \pi_{Z_{t-1},Z_t}, \quad (4)$$

where $\pi_{i,j}$ is a transition probability from state i to state j and $\pi_i$ is the initial probability of state i.

Finally, the observed value $Y_t^i$ of signal i at time t is generated from its state $X_t^i$ via a probabilistic observation model $p(Y_t^i|X_t^i,\xi_t^i)$, parameterized by $\xi_t^i$. For simplicity, the observation model can be independent of the state ($\xi_t^i=\xi^i$, $\forall t,i$), $$p(Y \mid X, \xi) = \prod_{t=0}^{T} \prod_{i=1}^{N} p(Y_t^i \mid X_t^i, \xi^i), \quad (5)$$

where $Y=\{Y_t\}_{t=1}^{T}$ is the observation sequence and $\xi$ is the collection of parameters $\{\xi^i\}_{i=1}^{N}$.

The choice of dependence and observations models is application specific and impacts the complexity of some of the inference steps. The dependencies, and therefore structure of the DBN 200, can be based on covariance in the data, as described further below.

Figure 3:
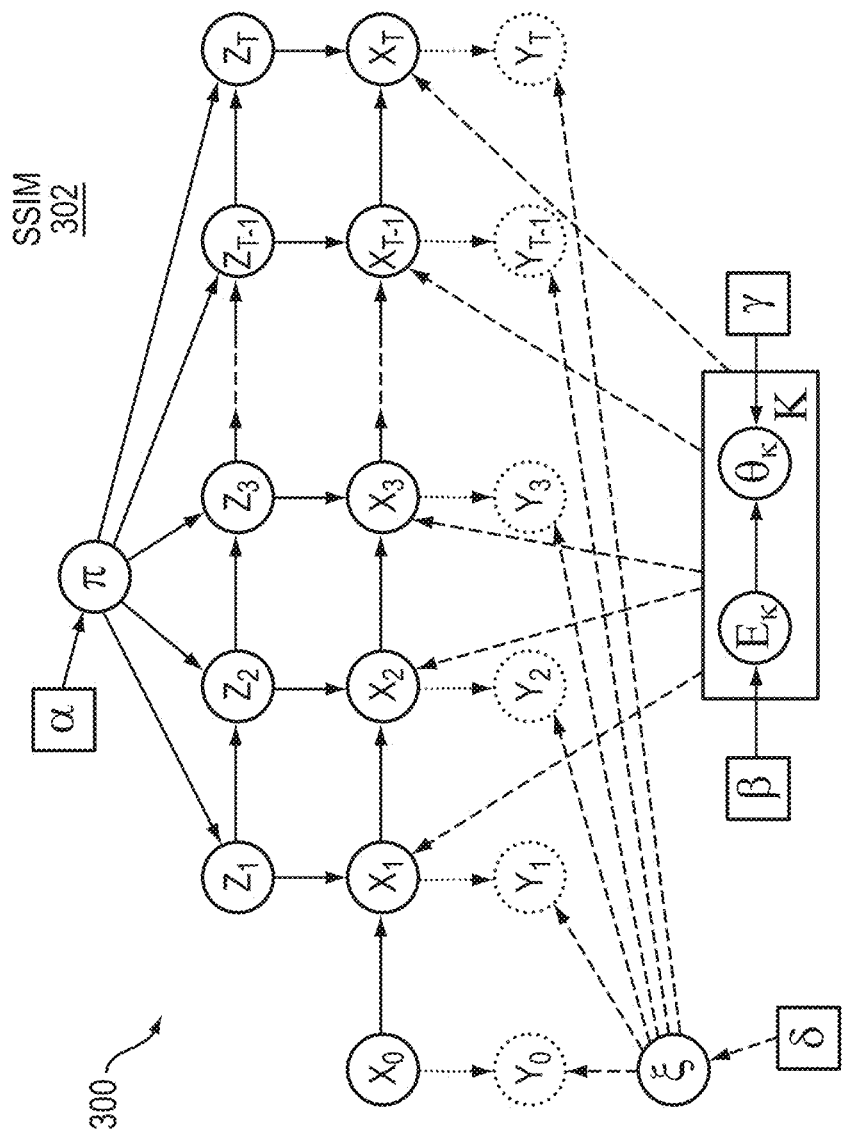
FIG. 3 is a diagram 300 illustrating an example embodiment of a SSIM generative model 312.

FIG. 3 is a diagram 300 illustrating an example embodiment of a SSIM generative model 312. The SSIM 302 incorporates probabilistic models, as described above, along with priors on structures and parameters. In the SSIM 312, multinomials $\pi$ are sampled from Dirichlet priors parametrized by $\alpha$ as $(\pi_1,K,\pi_K) \sim \text{Dir}(\alpha_1,K,\alpha_K)$ $(\pi_{i,1},K,\pi_{i,k}) \sim \text{Dir}(\alpha_{i,1},K,\alpha_{i,K})$ $\forall i$. K structures $\tilde{E}_k$ and parameters $\tilde{O}_k$ are sampled from the corresponding priors as $\tilde{E}_k$: $p(E;\beta)$, $\tilde{O}_k \sim p(\theta|_k;\gamma)$, $\forall k$. Parameters of the observation model are sampled as $\xi^i \sim p(\xi^i;\delta)$, $\forall i$. Initial values $X_0$ and $Y_0$ are generated as $X_0 \sim p(X_0|\theta_0)$ and $Y_0 \sim p(Y_0|X_0,\xi)$. For each $t=1,2,K,T$ (in that order), values of $Z_t$, $X_t$ and $Y_t$ are sampled as $Z_t \sim \text{Mult}(\pi_{Z_{t-1},1},K,\pi_{Z_{t-1},K})$ or $Z_t \sim \text{Mult}(\pi_1,K,\pi_K)$ if $t=1$, $X_t \sim p(X_t|X_{t-1,Z_t}\tilde{E},\tilde{O}_{Z_t})$ and $Y_t \sim p(Y_t|X_t,\xi)$.

Further, $\beta$ represents hyperparameters of the prior on dependence structure, $p(E;\beta)$, and $\gamma$ represent the hyperparameters of the prior on dependence model parameters given structure, $p(\theta|E;\gamma)$. These priors are the same for all K models. Since the distribution on structure is discrete, in the most general form, $\beta$ is a collection of parameters $\{\beta_E\}$ (one parameter for each structure), such that $\beta_E$ is proportional to the prior probability of E:

$$p(E;\beta) = \frac{1}{B}\beta_E \propto \beta_E, \quad (6)$$

where $B=\Sigma_E\beta_E$ is a normalization constant. The prior on parameters, $p(\theta|E;\gamma)$, may depend on the structure and $\gamma$ is, in general, a collection $\{\gamma_E\}$ of sets of hyperparameters, such that $p(\theta|E;\gamma)=p(\theta;\gamma_E)$.

Learning Bayesian network structures, under most assumptions, is an NP-hard problem. The number of possible structures is superexponential relative to the number of nodes, and, in a worst case, it can be necessary to calculate the posterior of each structure separately. The same holds in the case of inference of a dependence structure described above (e.g., a dependence structure of a homogenous DBN). The number of possible such structures is $2^{N^2}$.

Two fairly general assumptions can reduce the complexity of inference over structures. First, a modular prior-on structure and parameters are assumed, which decomposes as a product of priors on parent sets of individual signals and associated parameters:

$$p(E, \theta | \beta, \gamma) = \prod_{i=1}^{N} p(pa(i) | \beta) \, p(\theta^i | pa(i); \gamma). \quad (7)$$

As a result, parent sets can be chosen independently for each signal, and the total number of parent sets to consider is $N2^N$, which is exponential in the number of signals. Also, $\beta$ is no longer a collection of parameters per structure, but rather a collection of parameters $\{\beta_{i,pa(i)}\}$ one parameter for each possible parent set of each signal), such that $$p(pa(i); \beta) = \frac{1}{B_i} \beta_{i,pa(i)} \propto \beta_{i,pa(i)}, \quad (8)$$

where $B_i = \Sigma_s \beta_{i,s}$ are normalization constants. Modularity is also reflected in the posterior:

$$p(E, \theta | X; \beta, \gamma) = \prod_{i=1}^{N} p(pa(i) | X; \beta) \, p(\theta^i | X, pa(i); \gamma). \quad (9)$$

If, in addition, the number of parents of each signal is bounded by some constant M (e.g., a structure with a bounded in-degree), the number of parent sets to evaluate is further reduced to $O(N^{M+1})$, which is polynomial in N.

Linear Gaussian state-space switching interaction models (LG-SSIM) are an instance of SSIM in which the dependence and observation models of each signal i at each time point t are linear and Gaussian:

$$X_t^i = \tilde{A}_{Z_t}^i X_{t-1}^{(i,Z_t)} + w_t^i, w_t^i : N(0, \tilde{Q}_{Z_t}^i)$$

$$Y_t^i = C^i X_t^i + v^i, v^i : N(0, R^i). \quad (10)$$

$\tilde{A}^{ik}$ k is a dependence matrix and $\tilde{Q}^{ik}$ is a noise covariance matrix of signal i in the $k^{th}$ dependence model (i.e., $\theta_k^i = (\tilde{A}_k^i, \tilde{Q}_k^i)$). $C^i$ is the observation matrix and $R^i$ is the noise covariance matrix of the observation model of signal i (e.g., $\xi^i = (C^i, R^i)$). The Wishart distribution, a commonly used matrix normal inverse, is a conjugate prior on the parameters of a linear Gaussian model.

The model above implies a first order Markov process. However, the model can extend to a higher $r^{th}$ order process by defining a new state at time t as $X'_t = [X_t \, X_{t-1} \ldots X_{t-r+1}]$, (e.g., by incorporating a history of length r as a basis for predicting a state at time t+1). This model is a latent autoregressive (AR) LG-SSIM of AR order r, since the autoregressive modeling is done in the latent space.

Exact inference for the SSIM is generally intractable, but can be approximated. An efficient Gibbs sampling procedure is developed in Dzunic, Z. and Fisher III, J., *Bayesian Switching Interaction Analysis Under Uncertainty*, Proceedings of the Seventeenth International Conference on Artificial Intelligence and Statistics, pp. 220-228, 2014 (hereinafter "Dzunic"), which is herein incorporated by reference in its entirety, and shown in Gaussain-MP block sampling. The procedure alternates between sampling of (1) latent state sequence X, (2) latent switching sequence Z, (3) parameters of switching sequence dependence models $\pi$, (4) parameters of K state sequence transition models ($\overline{E}, \overline{\theta}$), and (5) parameters of the observation model $\overline{\xi}$. In each step, a corresponding variable is sampled from the conditional distribution of that variable given other variables (e.g., the rest of the variables are assumed fixed at that step).

This procedure is particularly efficient when the dependence model and the observation model distributions have conjugate priors, such as in LG-SSIM, as steps 4 and 5 are reduced to performing conjugate updates. In addition, an efficient message-passing method for batch sampling of the state sequence X, (1), above), is developed in Dzunic. On the other hand, (2) and (3), above are independent of these choices, and thus inherent to SSIM in general. (3) provides a conjugate update of a Dirichlet distribution. An efficient message passing method for batch sampling of the switching sequence Z can further be provided, as shown in Siracusa M. R. and Fisher III, J. W., *Tractable Bayesian Inference of Time-series Dependence Structure*, Proceedings of the Twelfth International Conference on Artificial Intelligence and Statistics, 2009 (hereinafter "Siracusa").

TABLE 2

| SSIM Gibbs sampler | LG-SSIM Method |
|---|---|
| 1. X ~ p(X \| Z, Y, $\overline{E}$, $\overline{\Theta}$, $\overline{\xi}$) | Gaussian-MP block sampling |
| 2. Z ~ p(Z \| X, $\overline{E}$, $\overline{\Theta}$, $\pi$) | discrete-MP block sampling |
| 3. $\pi$ ~ p($\pi$ \| Z; $\alpha$) | conjugate update |
| 4. $\overline{E}$, $\overline{\Theta}$ ~ p($\overline{E}$, $\overline{\Theta}$ \| Z, X; $\beta$, $\gamma$) | conjugate update |
| 5. $\overline{\xi}$ ~ p($\overline{\xi}$ \| X, Y; $\delta$) | conjugate update |

The data collected from the two structures consists of multiple sequences taken under intact and different damage scenarios. Since there is no change in conditions during recording of a single sequence, the SSIM model is modified to produce a single switching label on the entire sequence.

Figure 4:
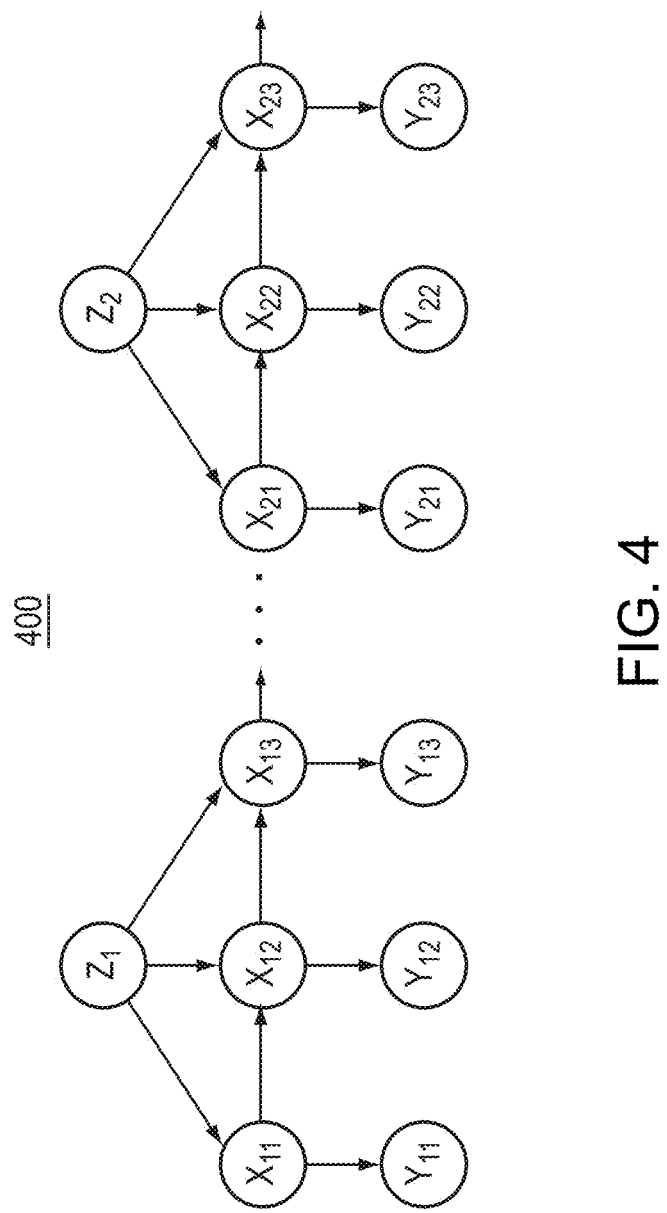
FIG. 4 is a diagram 400 illustrating a SSIM model modified for application to multiple homogeneous sequences.

FIG. 4 is a diagram 400 illustrating a SSIM model modified for application to multiple homogeneous sequences. Each observation sequence $Y_i = (Y_{i0}, Y_{i1}, \ldots, Y_{iT_i})$ is associated with a state sequence $X_i = (X_{i0}, X_{i1}, \ldots, X_{iT_i})$ and a switching label $Z_i$, where i is a sequence index and $T_i$ denotes the length of sequence i. Sequences are then classified according to the structure condition. Intact structure and each of the damage scenarios are associated with different class labels. The switching label of sequence i, $Z_i$, indicates its class membership.

Each classification problem has the following form. There are K classes, each class is associated with a training sequence $Y_k^{tr}$, $k \in \{1, 2, \ldots, K\}$, thus implicitly assuming $Z_k^{tr} = k$. Note that in case there are multiple training sequences from a single class, $Y_k^{tr}$ denotes a collection of such sequences. Given a test sequence $Y^{test}$ and the training data, the goal is to find the probability distribution of the test sequence label, (e.g. $P(Z^{test} = k | Y^{test}, Y_1^{tr}, Y_2^{tr}, \ldots, Y_K^{tr})$, for, each k). This probability can be computed in the following:

$$P(Z^{test} = k | Y^{test}, Y_1^{tr}, Y_2^{tr}, \ldots, Y_K^{tr}) \propto \quad (11)$$

$$P(Z^{test} = k, Y^{test} | Y_1^{tr}, Y_2^{tr}, \ldots, Y_K^{tr}) =$$

$$P(Z^{test} = k | Y_1^{tr}, Y_2^{tr}, \ldots, Y_K^{tr}) P(Y^{test} | Z^{test} = k, Y_1^{tr}, Y_2^{tr}, \ldots, Y_K^{tr}) \propto$$

$$P(Y^{test} | Z^{test} = k, Y_k^{tr})$$

assuming that, given the training data, the prior probability of a test sequence belonging to class k (prior to seeing the actual test sequence) is uniform, i.e., $P(Z^{test}=k|Y_1^{tr}, Y_2^{tr}, \ldots, Y_K^{tr}) \propto$ const. Therefore, the probability of the test sequence belonging to class k is proportional to its likelihood under the class k model, given the training sequence $Y_k^{tr}$ from that class. This likelihood is represented by $P(Y^{test}|Y_k^{tr})$ thus implicitly assuming conditioning on $Z^{test}=k$. It is computed by marginalizing out model structure and parameters (model averaging):

$$P(Y^{test} \mid Y_k^{tr}) = \sum_k \int_k P(Y^{test} \mid_{k,k}) P_{(k,k} \mid Y_k^{tr}) d_k. \quad (12)$$

The term $P(\tilde{\theta}_k, \hat{\theta}_k|Y_k^{tr})$ is the posterior distribution of model structure and parameters given the training sequence $Y_k^{tr}$), which then serves as a prior for evaluating the test sequence likelihood. The posterior distribution of the test sequence label, $Z^{test}$ is then obtained by normalizing the likelihoods of the test sequence against training sequences:

$$P(Z^{test} = k \mid Y^{test}, Y_1^{tr}, Y_2^{tr}, \ldots, Y_K^{tr}) = \frac{P(Y^{test} \mid Y_k^{tr})}{\sum_{k'} P(Y^{test} \mid Y_{k'}^{tr})}, \quad (13)$$

and the test sequence is classified according to the label that maximizes this distribution:

$$\hat{Z}^{test} =_k P(Z^{test}=k|Y^{test},Y_1^{tr},\ldots,Y_K^{tr}) =_k P(Y^{test}|Y_k^{tr}). \quad (14)$$

Computing the likelihood in Eq. 2 in closed form is intractable in general. The latent training and test state sequences, $X_k^{tr}$ and $X^{test}$, need to be marginalized out to compute $P_{(k,k}|Y_k^{tr})$ and $P(Y^{test}|_{k,k})$, respectively, and simultaneous marginalization of a state sequence and model structure and parameters is analytically intractable. Instead, this likelihood can be computed via simulation:

$$P(Y^{test} \mid Y_k^{tr}) \approx \frac{1}{N_s} \sum_{j=1}^{N_s} P(Y^{test} \mid \hat{E}_j, \hat{\theta}_j), (\hat{E}_j, \hat{\theta}_j) \colon P_{(k,k} \mid Y_k^{tr}). \quad (15)$$

$N_s$ instances of dependence models, $(\hat{E}_j, \hat{\theta}_j)$, are sampled from the posterior distribution of the model given training sequence. The test sequence likelihood is evaluated against each of the sampled models, and then averaged out. On the other hand, in an approximate model which assumes no observation noise (i.e., $X_i \equiv Y_i$), the likelihood in Eq. 2 can be computed in closed form by updating the conjugate prior on dependence structure and parameters with the training data and then evaluating the likelihood of the test data against thus obtained posterior.

In an embodiment of the present invention, a method detects changes in a structure due to damage, provides a probabilistic description of occurrence of damage in the structure, and infers the physical structure without any prior knowledge or training of the actual structure.

Sequences are classified according to the structure condition, as described in each example dataset. There are 10 sequences of each class. The system performs 10 rounds of classification. In a particular round j, sequence j from each class is included in the training set, while the other 9 sequences of each class are used for testing. Classification results are then averaged over all 10 rounds.

A latent-AR LG-SSIM model is employed for classification. AR order 5 is sufficient to produce an accurate classification result, although increasing the order higher can further increase the accuracy of the classification result. Hyperparameter values are either estimated from data or set in a general fashion (e.g., implying a broad prior distribution). All experiments assume presence of a self-edge for each node in the dependence structure. The bound on the number of additional allowed parents is set up to three in the single column case. In the three story two bay structure data, however, the best classification results are obtained when no additional parents (other than the self-edge) are allowed.

The classification results obtained from the full SSIM model. In comparing the classification results to an approximate model that assumes no observation noise, the full model performs marginally better, but at the significant additional computational cost. Therefore, the approximate model can be employed as described below.

First, for each pair of classes i and j, the system computes the average log-likelihood of a test sequence from class i given a training sequence from class j. The average is computed over all pairs of sequences from classes i and j. The average log-likelihoods do not account for the variability within a class and thus can only partially predict classification results. However, they can be considered as a measure of asymmetric similarity between classes. In particular, the comparison of log-likelihoods of a test class given different training classes is useful to indicate its possible "confusion" with other classes. The log domain is chosen to bring likelihoods closer to each other for the purpose of illustration because the differences in likelihoods are huge in their original domain.

Figure 5B:
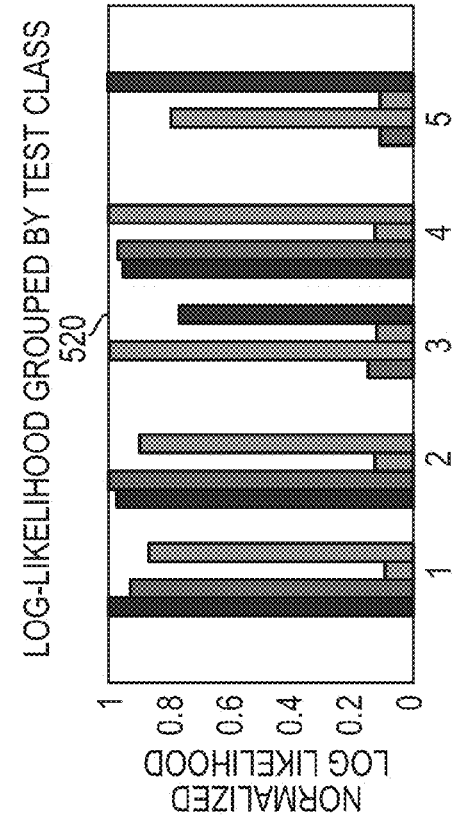
FIG. 5B illustrates class-class log-likelihood bar groups for each pair of classes i and j.
Figure 5D:
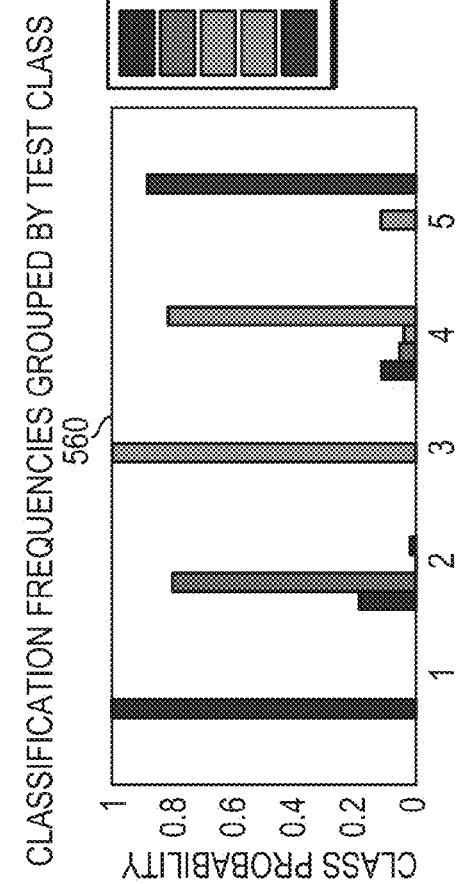
FIG. 5D illustrates classification frequency results in a bar graph for each pair of classes i and j.
Figure 5A:
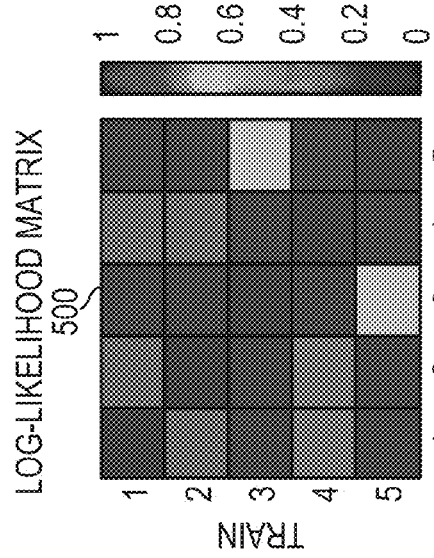
FIG. 5A and illustrates a class-class log-likelihood matrix for each pair of classes i and j.

FIG. 5A illustrates the class-class log-likelihood matrix 500 for each pair of classes i and j, while FIG. 5B illustrates the resulting class-class log-likelihood 520 for each pair of classes i and j. For the purpose of visualization, each column is normalized to contain values between 0 and 1, which does not change the relative comparison of values within a column. A different visualization of the same log-likelihood matrix is shown in FIG. 5B, in which each group of bars corresponds to a single test class, while bars within a group correspond to different training classes. Clearly, the average log-likelihood of each class is the highest when conditioned on sequences from the same class (e.g., diagonal entries). This suggests that the model indeed captures important features pertained to each class via posterior distribution of parameters. However, for some classes, the log-likelihood is also relatively high when conditioned on some of the classes other than itself. For example, intact class (1) and the two minor damage classes (2) and (4) are the closest to each other in that sense. Also, the two major damage classes (3) and (5) are close to each other, although less than the previous three classes. On the other hand, there is a significantly higher separation between the low- and high-damage classes, and, a sequence from one of these groups is rarely misclassified as belonging to a class from the other group.

Figure 5C:
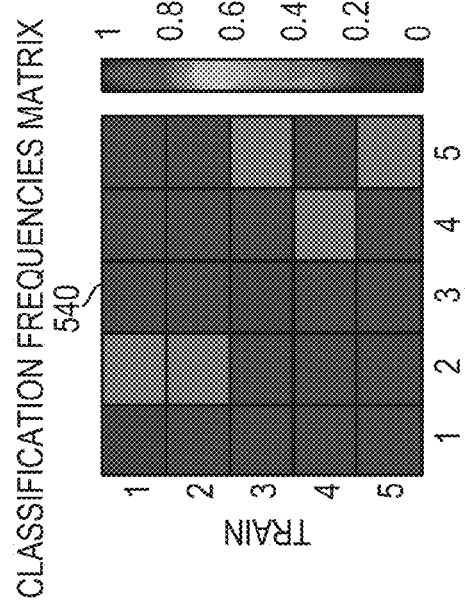
FIG. 5C illustrates classification frequency results in a matrix for each pair of classes i and j.

FIGS. 5C and 5D illustrate classification frequency results in a respective matrix 540 and bar groups 560. Again, these are two different visualizations of the same results. For each pair of classes, test class i and training class j, the frequency of classifying a test sequence from class i as belonging to class j is shown. Therefore, each column in the matrix in FIG. 5C, as well as each group of bars in FIG. 5D, must sum to one. Overall, sequences are classified correctly most of the times (high diagonal values). Sequences from the two minor damage classes (2) and (4) are occasionally misclassified as belonging to the intact class (1), while sequences from the two major damage classes (3) and (5) are never misclassified as belonging to one of the low-damage classes and occasionally misclassified as belonging to the other major damage class.

Figure 6A:
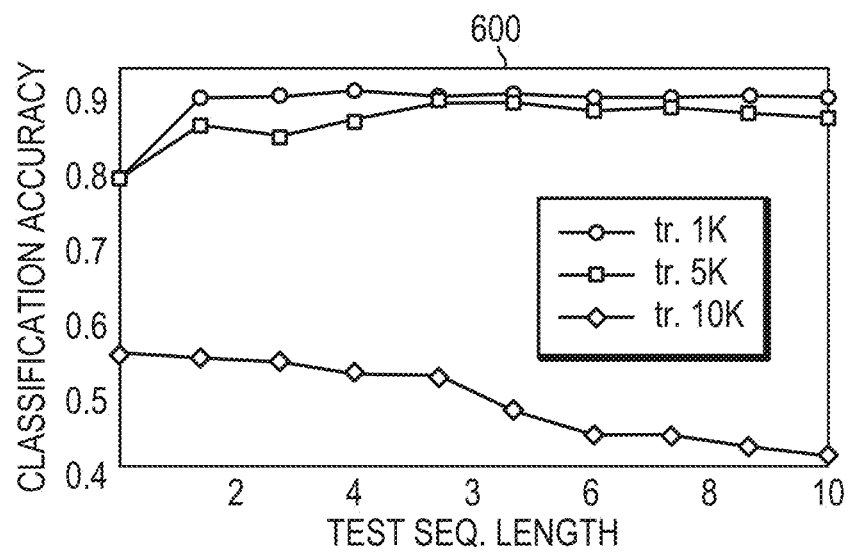
FIG. 6A is a graph illustrating the overall classification accuracy, averaged over all, classes, for three different training sequence lengths 1,000, 5,000 and 10,000, and ten test sequence lengths ranging from 1,000 to 10,000.

Finally, classification accuracy is analyzed as a function of training and test sequence lengths. FIG. 6A illustrates a graph 600 of the overall classification accuracy, averaged over all classes, for three different training sequence lengths, 1,000, 5,000 and 10,000, and ten test sequence lengths ranging from 1,000 to 10,000. For a fixed training sequence length, classification accuracy increases as the test sequence length increases only until it becomes equal to the training sequence length, after which it start decreasing because the properties of these time-series data change over time. Namely, subsequence for training and testing are always extracted starting at the same time in all sequences. Therefore, when training and test sequences are of the same length, they are aligned with respect to where they are in the measurement process, assuming that different sequences are measured under the same or similar conditions.

However, when the test sequence length increases beyond the training sequence length, test sequences start to increasingly incorporate parts of the process that were not included in training. Similarly, when test sequences are shorter than training sequences, training sequences include characteristics of a broader window of the process than is tested. This also can explain why the classification results are overall not better when the training sequence length is 10,000 then when it is 5,000. Likely, a window of 10,000 is too broad, and the additional amount of data, the second 5,000 time samples, can hinder processing because it can differs in behavior than the first 5,000 time samples. Naturally, there is a trade-off between this behavior and the sequence length. For example, 1,000 time samples is too short of a time period, and the results with that length are clearly worse. The phenomenon explained here could be attributed to the nature of excitation used in this setup, which is free vibration. The results with the shaker excitation, shown below, do not follow this pattern and behave within expectations—more test or training data consistently yields higher accuracy.

Figure 6B:
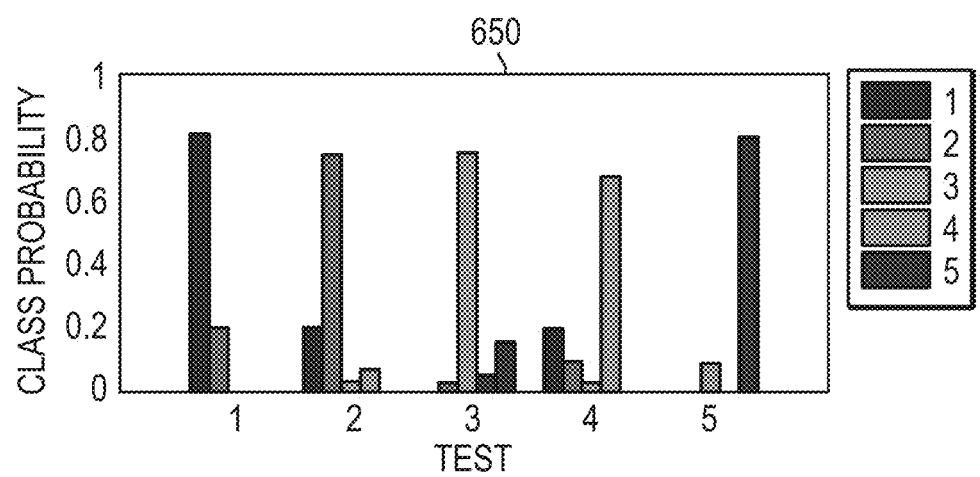
FIG. 6B is a graph illustrating classification results for training and test sequence lengths equal to 5,000 and 1,000, respectively.

FIG. 6B is a bar group 650 illustrating classification results for training and test, sequence lengths equal to 5,000 and 1,000 respectively, which could be compared to the results in FIG. 5D, in which both lengths are 5,000.

Figure 7A:
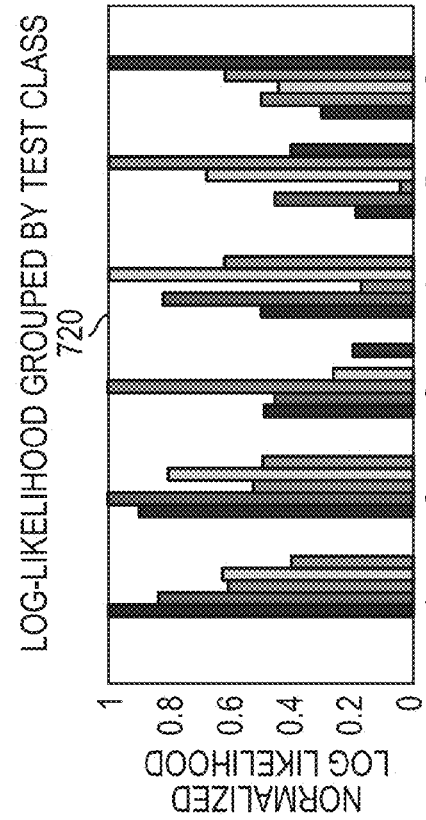
FIGS. 7A-B illustrate a respective matrix and bar group of the same set of results on the 3-story 2-bay structure data.
Figure 7B:
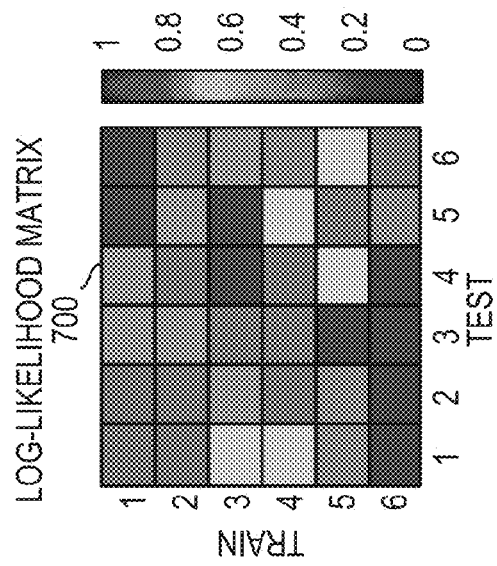

FIGS. 7A-B are a respective matrix 700 and bar group 720 illustrating the same set of results on the 3-story 2-bay structure data. Average log-likelihoods between all pairs of classes are shown as a matrix 700 in FIG. 7A and as bars grouped 720 by test class in FIG. 7B. Again, these log-likelihoods are normalized such that each column in the matrix are between 0 and 1. As with the single column structure, the average log-likelihood of a sequence of one class is the highest when conditioned on a sequence from that same class (diagonal elements), and the highest confusion is between the low-damage classes, namely, the intact class, (1), and the two minor damage classes, (2) and (4). The lesser major damage classes, (3) and (5), seem to be occasionally confused as classes with either smaller or higher damage relative to them. Finally, the greater major damage class, (6), is most similar to the lesser major damage classes.

Figure 7C:
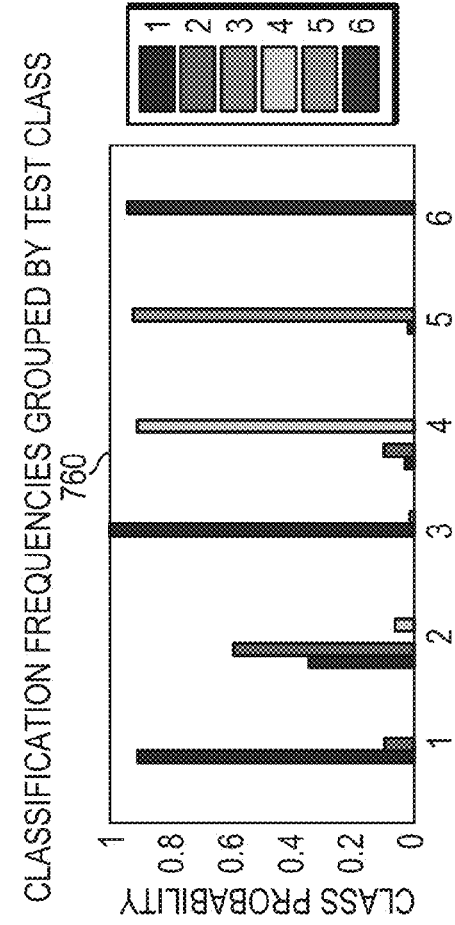
FIGS. 7C-D illustrate classification results in terms of frequencies (fraction of times a sequence from one class is classified as belonging to another class) as a respective matrix and bars groups.
Figure 7D:
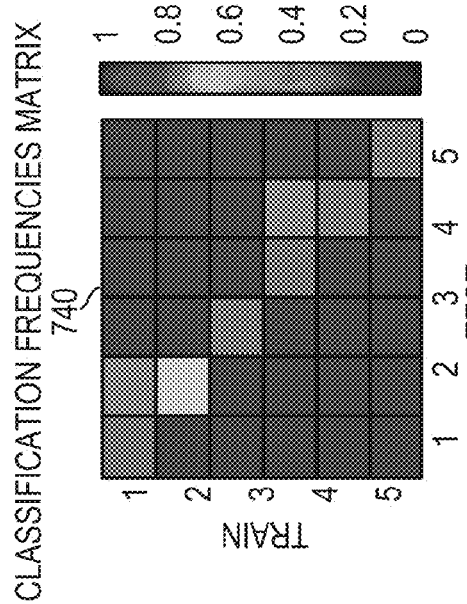

Classification results in terms of frequencies (fraction of times a sequence from one class is classified as belonging to another class) are shown as a matrix 740 in FIG. 7C and as bars grouped 760 by test class in FIG. 7D. Sequences from major damage classes (3, 5 and 6) are classified almost perfectly. On the other hand, some confusion between the three low-damage classes (1, 2 and 4) is present. In particular, sequences from the class that corresponds to a minor damage at node 17 are often misclassified as belonging to the intact class. This can be attributed to the closeness of this node to the shaker.

Figure 8A:
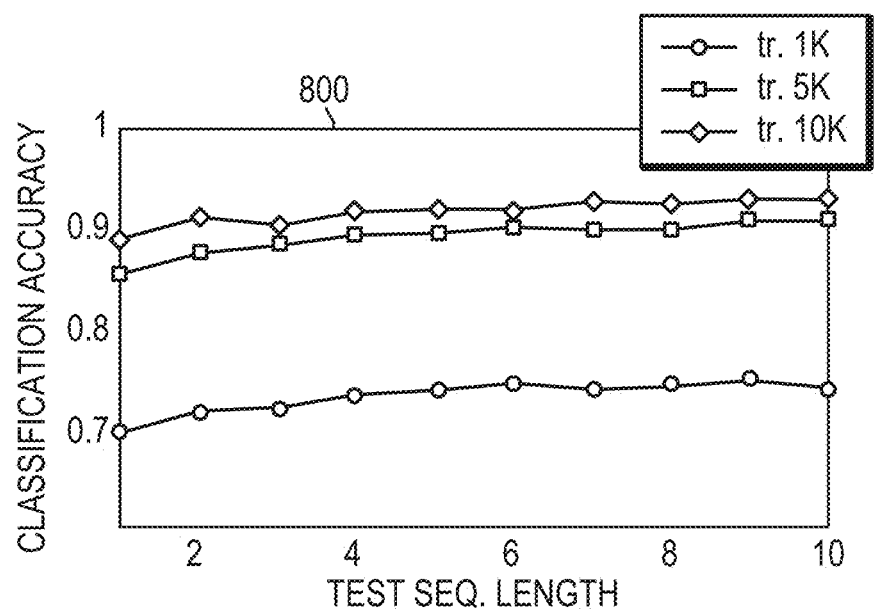
FIG. 8A illustrates overall classification accuracy as a function of training and test sequence lengths.
Figure 8B:
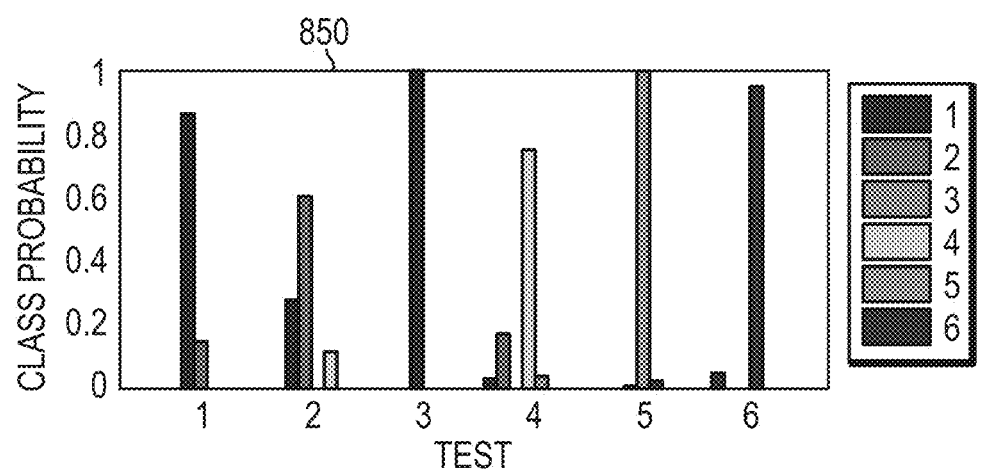
FIG. 8B is a bar group illustrating an example class probability as a function of tests.

FIG. 8A illustrates overall classification accuracy as a function of training and test sequence lengths. Three different training sequence lengths were used, 1,000, 5,000 and 10,000, while the test sequence length is varied from 1,000 to 10,000. Unlike the single column structure results, classification accuracy on the three-story two-bay structure data consistently improves with the increased length of either training or a test sequence. This trend suggests that there is likely no significant variability in the dynamics of a sequence over time, and, consequently, longer sequences represent effectively more data. This is an expected behavior, since excitation provided by the shaker is uniform over time. FIG. 8B is a bar group 850 illustrating an example class probability as a function of tests.

The results of inference over dependence structures are also analyzed. The most likely parent set of each node obtained by structure inference on a single sequence (from intact class) is shown in Table 3, below. Three different results are shown, in which the number of additional parents (other than self, which is assumed) is bounded to 1, 2 and 3. As can be seen, these data favor larger parent sets and the most likely parent set for each node in each scenario exhausts the constraint. Clearly, each node is often best explained by nearby nodes. The exact meaning of these results as to how they correspond to the physics of the problem requires further investigation. Besides explaining data and properties of a physical structure, one possible application of dependence structure analysis is in recovering the topology of a physical structure when it is unknown. Another interesting observation is that, while by increasing the number of allowed parents, the new "best" parent set of a node is most commonly a superset of the previous one, this is not always the case. For example, the best parent of size 1 of node 5 is 14. However, node 14 is not included in its best parent sets of sizes 2 and 3. This reiterates the need for dependence inference at the structure level rather than at the pairwise level simply adding nodes from k most likely pairwise relationships does not result in the mostly likely parent set of size k.

TABLE 3

Most likely parent sets of each node when the number of additional parents is bounded to 1, 2, and 3. Each node is assumed to be its own parent. Only additional parents are shown.

| | node | | | | | | | | | | | | | | | | | |
|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 |
| 1-bound | 10 | 11 | 6 | 7 | 14 | 3 | 8 | 2 | 3 | 1 | 2 | 15 | 14 | 5 | 12 | 13 | 18 | 12 |
| 2-bound | 7 | 5 | 6 | 1 | 2 | 3 | 1 | 2 | 3 | 1 | 2 | 15 | 7 | 5 | 12 | 13 | 11 | 12 |
| | 10 | 11 | 9 | 7 | 8 | 9 | 8 | 9 | 6 | 2 | 17 | 18 | 14 | 11 | 18 | 17 | 18 | 16 |

TABLE 3-continued

Most likely parent sets of each node when the number of additional parents is bounded to 1, 2, and 3. Each node is assumed to be its own parent. Only additional parents are shown.

| | node | | | | | | | | | | | | | | | | | |
|---|---|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 | 17 | 18 |
| 3 bound | 4 | 1 | 2 | 1 | 2 | 3 | 1 | 2 | 3 | 1 | 2 | 9 | 14 | 5 | 3 | 10 | 11 | 12 |
| | 7 | 5 | 6 | 7 | 8 | 9 | 4 | 5 | 6 | 2 | 10 | 15 | 15 | 11 | 12 | 13 | 15 | 15 |
| | 10 | 11 | 9 | 16 | 17 | 15 | 8 | 9 | 15 | 7 | 17 | 18 | 16 | 18 | 18 | 17 | 18 | 16 |

Here, consider a linear Gaussian model of a multivariate signal $X_t$, $$X_t = AX_{t-1} + w_t, w_t : N(0, Q), \quad (16)$$

with parameters A (transition matrix) and Q (noise covariance matrix).

Assume that $\Theta = (A, Q)$ follows a matrix-normal inverse-Wishart distribution, which is a conjugate prior to the dependence model $N(X_t; AX_{t-1}, Q)$:

$$p(A, Q; M, \Omega, \Psi, \kappa) = MN\text{-}IW(A, Q; M, \Omega, \Psi, \kappa) = MN(A; M, Q, \Omega) IW(Q; \Psi, \kappa). \quad (17)$$

This is a product of (1) the matrix-normal distribution, $$MN(A; M, Q, \Omega) = \frac{\exp\left(-\frac{1}{2} tr\left[\Omega^{-1}(A-M)^T Q^{-1}(A-M)\right]\right)}{(2\pi)^{dl/2} |\Omega|^{d/2} |Q|^{l/2}}, \quad (18)$$

where d and l are the dimensions of matrix A ($A_{d \times l}$), while $M_{d \times l}$, $Q_{d \times d}$ and $\Omega_{l \times l}$ are the mean, the column covariance and the row covariance parameters; and (2) the inverse-Wishart distribution $$IW(Q; \Psi, \kappa) = \frac{|\Psi|^{\kappa/2}}{2^{\kappa d/2} \Gamma_d(\kappa/2)} |Q|^{-(\kappa+d+1)/2} \exp\left(-\frac{1}{2} tr(\Psi Q^{-1})\right), \quad (19)$$

where d is the dimension of matrix Q ($Q_{d \times d}$) and $\Gamma_d()$ is a multivariate gamma function while $\kappa$ and $\Psi_{d \times d}$ are the degree of freedom and the inverse scale matrix parameters. Note how the two distributions are coupled. The matrix normal distribution of the dependence matrix A depends on the covariance matrix Q, which is sampled from the inverse Wishart distribution.

Due to conjugacy, the posterior distribution of parameters A and Q given data sequence $X_0, X_1, \ldots, X_T$ is also a matrix-normal inverse-Wishart distribution:

$$p(A, Q | X_{0:T}; M, \Omega, \Psi, \kappa) = MN\text{-}IW(A, Q; M', \Omega', \Psi', \kappa') = MN(A; M', Q, \Omega') IW(Q; \Psi', \kappa'), \text{ where} \quad (20)$$

$$\Omega' = \left(\Omega^{-1} + \sum_{t=0}^{T-1} X_t X_t^T\right)^{-1} \quad (21)$$

$$M' = \left(M\Omega^{-1} + \sum_{t=1}^{T} X_t X_{t-1}^T\right)\Omega'$$

$$\kappa' = \kappa + T$$

$$\Psi' = \Psi + \sum_{t=1}^{T} X_t X_t^T + M\Omega^{-1}M^T - M'\Omega'^{-1}M'^T.$$

The teachings of all patents, published applications and references cited herein are incorporated by reference in their entirety.

Figure 9:
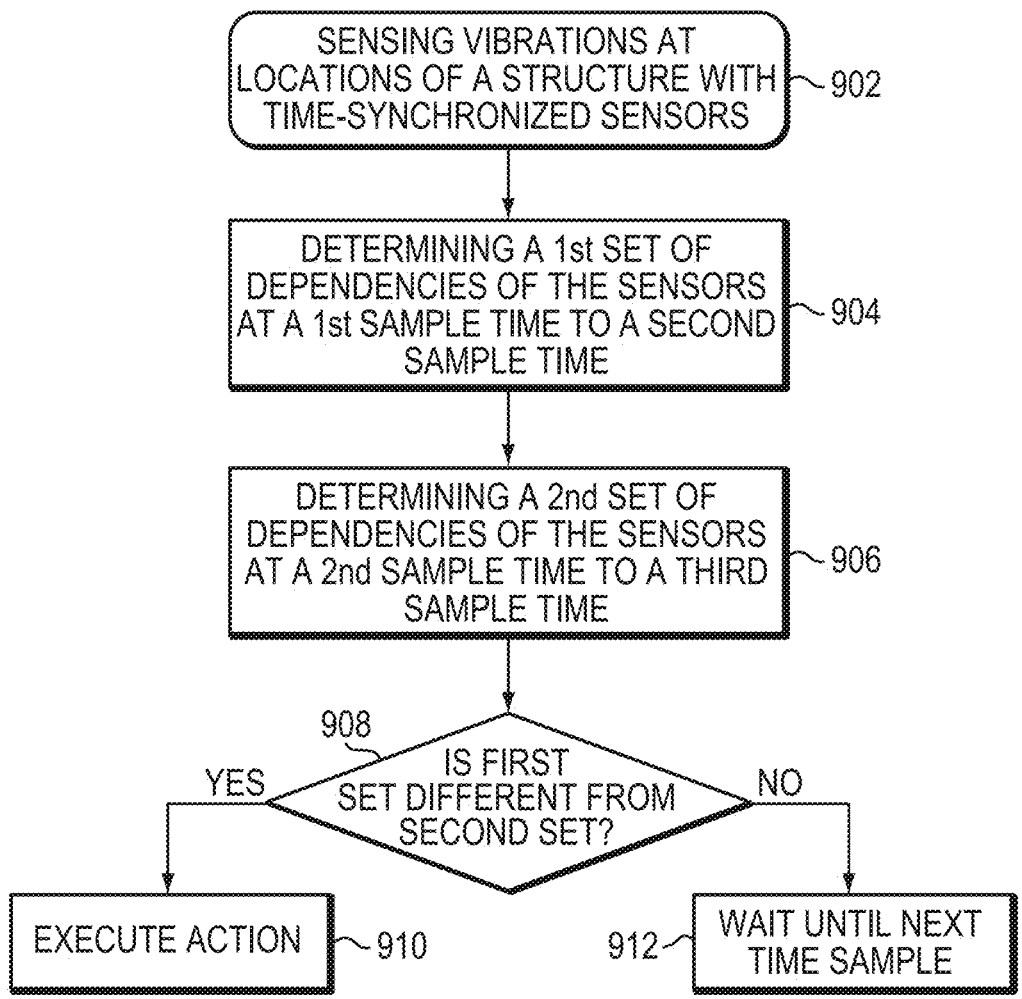
FIG. 9 is a flow diagram illustrating an example embodiment of a process employed by the present invention.

FIG. 9 is a flow diagram 900 illustrating an example embodiment of a process employed by the present invention. The process senses vibrations at locations of a structure with time-synchronized sensors (902). A person of ordinary skill in the art can recognize that the time-synchronized sensors can be sensors such as accelerometers, vibration detectors, or piezoelectric vibration detectors that are enabled to establish a distributed communication network through a communications protocol such as WiFi. They can connect either ad-hoc or via a coordinating sensor node that routes the communications. Further, the sensors can be imaging sensors that employ motion magnification to detect vibration as well.

From the sensed vibration, the process determines a first set of dependencies of the sensors at a first sample time to a second sample time (904). Then the process determines a second set of dependencies of the sensors at a second sample time to a third sample time (906). These sets of dependencies can be in the form of a DBN as shown by FIG. 2, above.

Based on these determined sets of dependencies, the process determines whether the first set is different from the second set (908). If so, the process directs the execution of an action, such as providing an alert to an operator, providing an online alert, deactivating a feature of the structure, or activating a safety feature of the structure (910). Otherwise, it waits until the next time sample and repeats (912).

Figure 10:
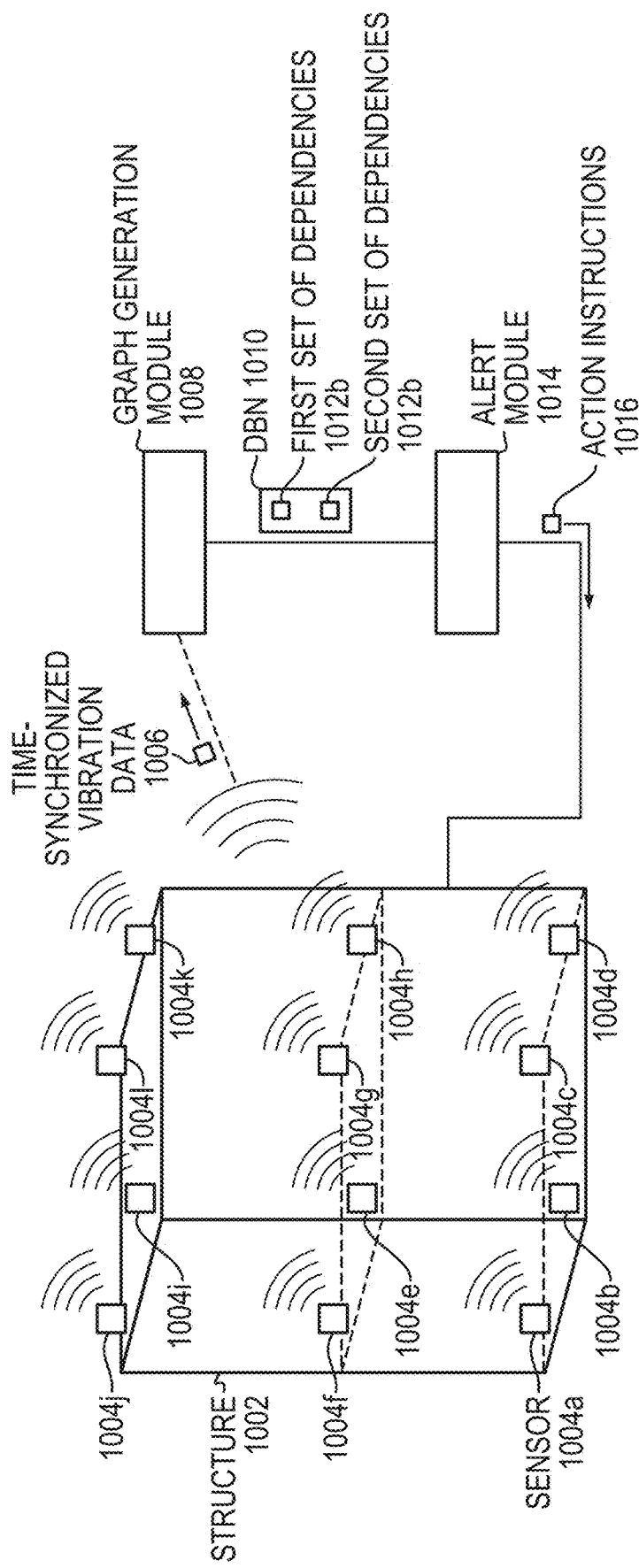
FIG. 10 is a block diagram illustrating an example embodiment of the present invention.

FIG. 10 is a block diagram 1000 illustrating an example embodiment of the present invention. A structure 1002 is equipped with a plurality of sensors 1004a-1 at various locations throughout the structure 1002. A person of ordinary skill in the art can recognize that the sensors 1004a-1 are configured to communicate wirelessly and further be time-synchronized. The plurality of sensors can be accelerometers or other vibratory sensors. In another embodiment, a plurality of imaging devices such as camera can be mounted from a separate location to image different parts of the structure 1002 and calculate vibrations using motion magnification. In yet another embodiment, a single high-resolution camera can image the structure 1002, and different portions of the image can be used with motion magnification to determine vibrations at different portions of the building. The sensors 1004a-1 collectively, or through a super-sensor note/router, send time-synchronized vibration data 1006 to a graph generation module 1008.

The graph generation module 1008 is configured to determine a first set of dependencies 1012a of all sensors of at a first sample time to any sensors of a second sample time, where the second sample time being later than the first sample time, and also determine a second set of dependencies 1012b of all sensors at the second sample time to any sensors of a third sample time, the third sample time being later than the second sample time. The sets of dependencies 1012*a-b* make up at least part of a DBN 1010. The DBN 1010 with the sets of dependencies 1012*a-b* are sent to an alert module 1014. The alert module is configured to determine whether the first set of dependencies 1012*a* is different from the second set of dependencies 1012*b*. If so, the alert module sends action instructions 1016 to the structure 1002 or other operator. The action instructions 1016 can be action providing an alert to an operator, providing an online alert, deactivating a feature of the structure, such as a drill, or activating a safety feature of the structure, such as a nuclear power plant. If the first set 1012*a* is not different from the second set 1012*b*, however, then the action instructions 1016 can be blank, instructions to do nothing, or not sent at all.

Figure 11:
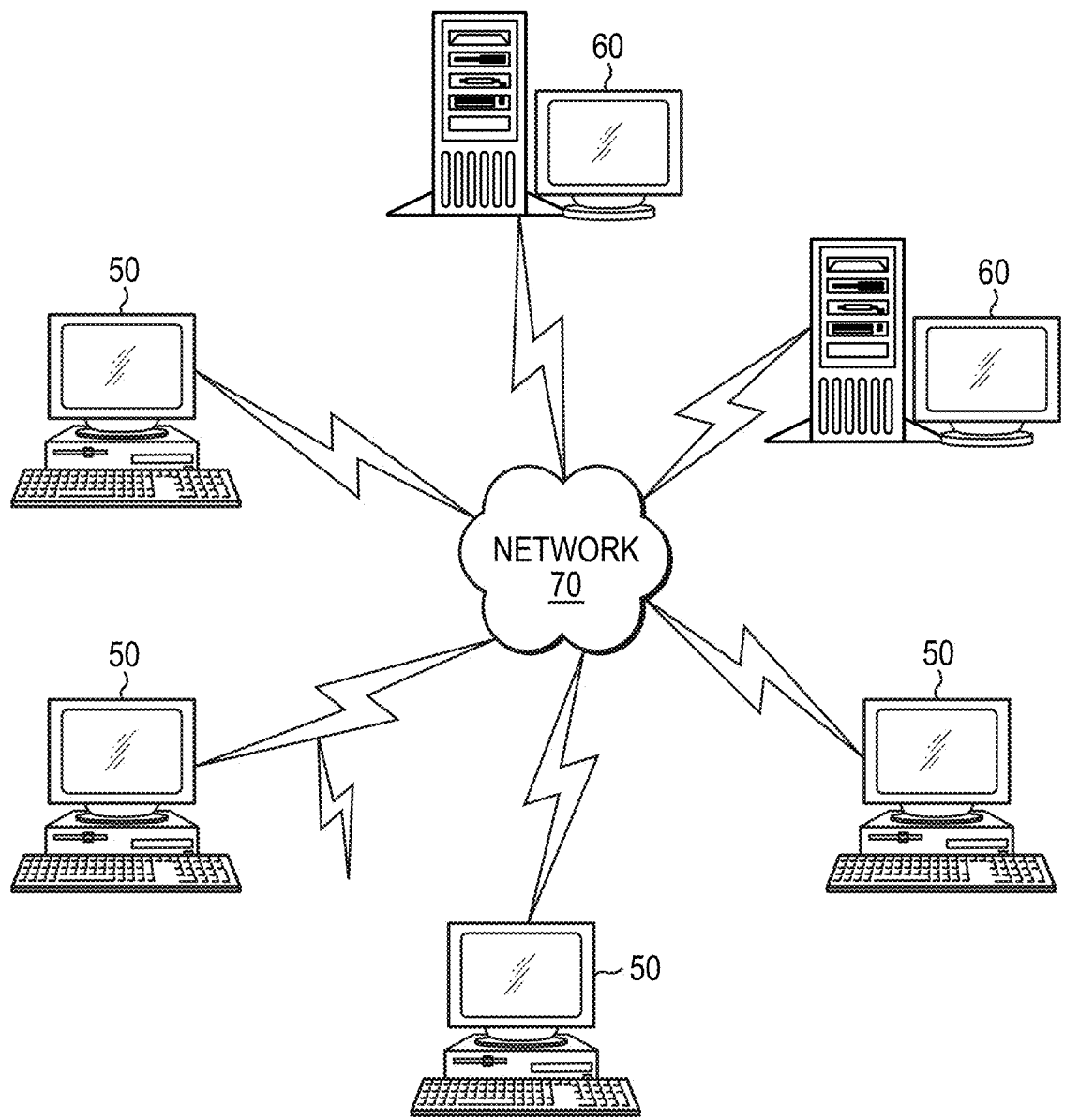
FIG. 11 illustrates a computer network or similar digital processing environment in which embodiments of the present invention may be implemented.

FIG. 11 illustrates a computer network or similar digital processing environment in which embodiments of the present invention may be implemented.

Client computer(s)/devices 50 and server computer(s) 60 provide processing, storage, and input/output devices executing application programs and the like. The client computer(s)/devices 50 can also be linked through communications network 70 to other computing devices, including other client devices/processes 50 and server computer(s) 60. The communications network 70 can be part of a remote access network, a global network (e.g., the Internet), a worldwide collection of computers, local area or wide area networks, and gateways that currently use respective protocols (TCP/IP, Bluetooth®, etc.) to communicate with one another. Other electronic device/computer network architectures are suitable.

Figure 12:
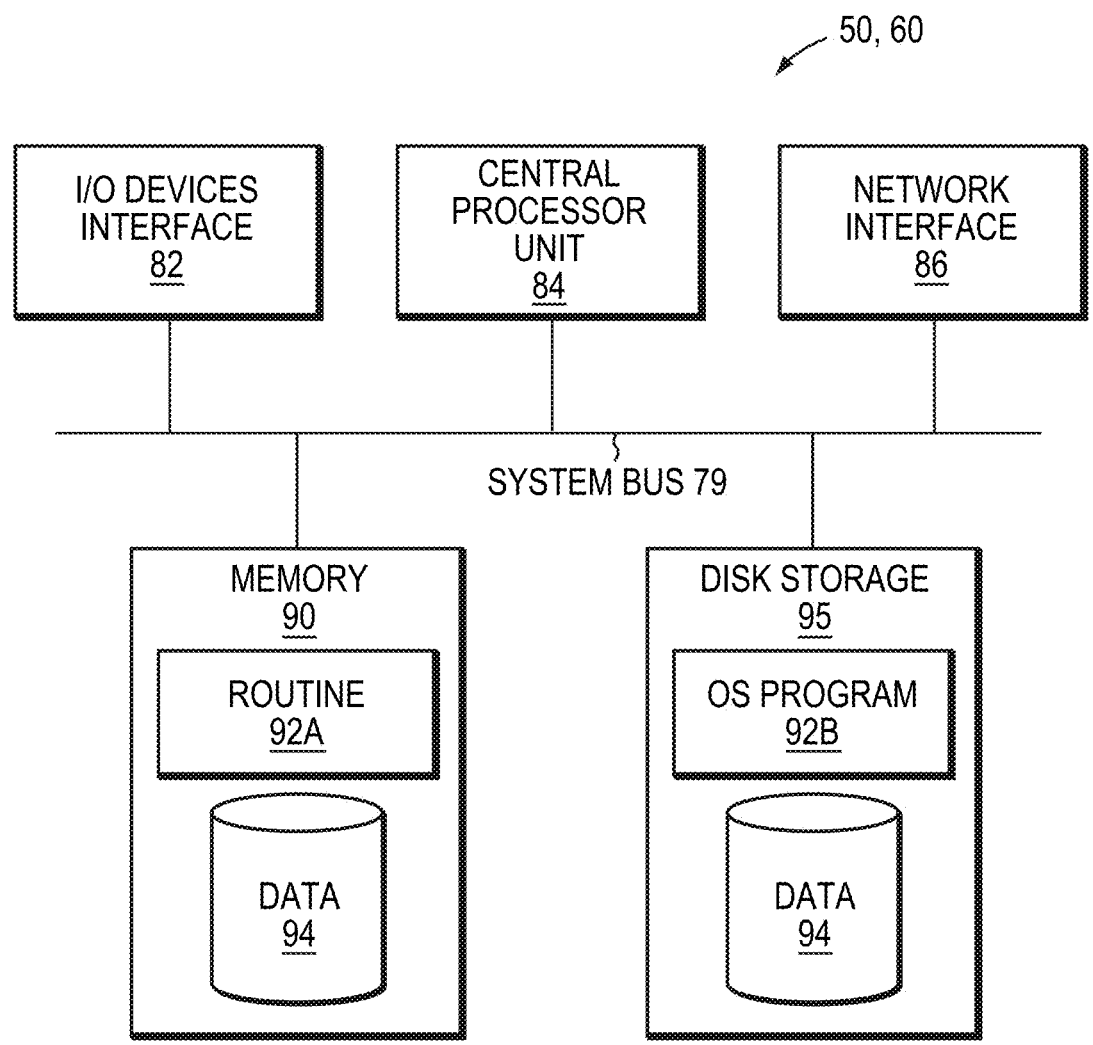
FIG. 12 is a diagram of an example internal structure of a computer (e.g., client processor/device or server computers) in the computer system of FIG. 11.

FIG. 12 is a diagram of an example internal structure of a computer (e.g., client processor/device 50 or server computers 60) in the computer system of FIG. 11. Each computer 50, 60 contains a system bus 79, where a bus is a set of hardware lines used for data transfer among the components of a computer or processing system. The system bus 79 is essentially a shared conduit that connects different elements of a computer system (e.g., processor, disk storage, memory, input/output ports, network ports, etc.) that enables the transfer of information between the elements. Attached to the system bus 79 is an I/O device interface 82 for connecting various input and output devices (e.g., keyboard, mouse, displays, printers, speakers, etc.) to the computer 50, 60. A network interface 86 allows the computer to connect to various other devices attached to a network (e.g., network 70 of FIG. 11). Memory 90 provides volatile storage for computer software instructions 92 and data 94 used to implement an embodiment of the present invention (e.g., graph generation module and damage determination module as described above). Disk storage 95 provides non-volatile storage for computer software instructions 92 and data 94 used to implement an embodiment of the present invention. A central processor unit 84 is also attached to the system bus 79 and provides for the execution of computer instructions.

In one embodiment, the processor routines 92 and data 94 are a computer program product (generally referenced 92), including a non-transitory computer-readable medium (e.g., a removable storage medium such as one or more DVD-ROM's, CD-ROM's, diskettes, tapes, etc.) that provides at least a portion of the software instructions for the invention system. The computer program product 92 can be installed by any suitable software installation procedure, as is well known in the art. In another embodiment, at least a portion of the software instructions may also be downloaded over a cable communication and/or wireless connection. In other embodiments, the invention programs are a computer program propagated signal product embodied on a propagated signal on a propagation medium (e.g., a radio wave, an infrared wave, a laser wave, a sound wave, or an electrical wave propagated over a global network such as the Internet, or other network(s)). Such carrier medium or signals may be employed to provide at least a portion of the software instructions for the present invention routines/program 92.

While this invention has been particularly shown and described with references to example embodiments thereof, it will be understood by those skilled in the art that various changes in form and details may be made therein without departing from the scope of the invention encompassed by the appended claims.

What is claimed is:

1. A method comprising:
    sensing a plurality of vibration signals at each of a plurality of locations of a structure, each vibration signal sensed by a respective time-synchronized sensor mounted at the respective location on the structure;
    generating a first graph of temporal dependencies, each edge of the first graph representing whether a respective vibration signal at a first sample time is probabilistically dependent on another vibration signal at a second sample time, the second sample time being later than the first sample time;
    generating a second graph of temporal dependencies, each edge of the second graph representing whether the respective vibration signal at the second sample time is probabilistically dependent on the another vibration signal of a third sample time, the third sample time being later than the second sample time; and
    determining whether the structure has changed if the edges of the first graph of temporal dependencies are different from the edges of the second graph of temporal dependencies.

2. The method of claim 1, further comprising executing an action at the structure if the structure has changed, wherein the action is at least one of:
    providing an alert to an operator,
    providing an online alert;
    deactivating a feature of the structure;
    activating a high-power mode of the plurality of time-synchronized sensors;
    activating a plurality of dormant time-synchronized sensors; and
    activating a safety feature of the structure.

3. The method of claim 1, wherein the plurality of time-synchronized sensors are accelerometers.

4. The method of claim 1, further comprising:
    detecting images at the plurality of locations of the structure, wherein
    sensing the vibrations at the plurality of locations of the structure further performs motion magnification on the detected images by a plurality of cameras.

5. The method of claim 1, wherein determining whether the structure has changed includes generating a probability the structure has sustained damage.

6. The method of claim 1, further comprising connecting the plurality of time-synchronized sensors wirelessly.

7. The method of claim 1, wherein the plurality of time-synchronized sensors are configured to idle in a low-power mode, activate in a high-power mode, and then return to the low-power mode.

8. The method of claim 1, further comprising:
    generating a numerical model of a configuration of the structure based on the first graph of temporal dependencies and second graph of temporal dependencies.

9. The method of claim 1, further comprising:
updating a first numerical model of a configuration of the structure based on the first graph of temporal dependencies and the second graph of temporal dependencies, said updating resulting in a second numerical model; and if the second numerical model is different from the first numerical model, determining that the structure has changed.

10. A system comprising:
a plurality of time-synchronized sensors configured to sense a plurality of vibration signals at each of a plurality of locations of the structure, each sensor of the plurality of time-synchronized sensors being mounted at a respective location of the plurality of locations;
a processor; and
a memory with computer code instructions stored therein, the memory operatively coupled to said processor such that the computer code instructions configure the processor to implement:
a graph generation module configured to:
generate a first graph of temporal dependencies, each edge of the first graph representing whether a respective vibration signal at a first sample time is probabilistically dependent on another vibration signal of a second sample time, the second sample time being later than the first sample time,
generate a second graph of temporal dependencies, each edge of the second graph representing whether the respective vibration signal at the second sample time is probabilistically dependent on the another vibration signal of a third sample time, the third sample time being later than the second sample time; and
a damage determination module configured to determine whether the structure has changed if the first graph of temporal dependencies is different from the second graph of temporal dependencies.

11. The system of claim 10, wherein the computer code instructions further configure the processor to implement an action module configured to execute an action at the structure if the structure has changed, wherein the action is at least one of:
providing an alert to an operator,
providing an online alert;
deactivating a feature of the structure;
activating a high-power mode of the plurality of time-synchronized sensors;
activating a plurality of dormant time-synchronized sensors; and
activating a safety feature of the structure.

12. The system of claim 10, wherein the plurality of time-synchronized sensors are accelerometers.

13. The system of claim 10, further comprising:
a plurality of cameras detecting images at the plurality of locations of the structure,
wherein the computer code instructions further configure the processor to implement a motion magnification module configured to sense the vibrations at the plurality of locations of the structure by performing motion magnification on the detected images by the plurality of cameras.

14. The system of claim 10, wherein the computer code instructions further configure the processor to determine whether the structure has changed by generating a probability the structure has sustained damage.

15. The system of claim 10, wherein the plurality of time-synchronized sensors are connected wirelessly.

16. The system of claim 10, wherein the plurality of time-synchronized sensors are configured to idle in a low-power mode, activate in a high-power mode, and then return to the low-power mode.

17. The system of claim 10, wherein the computer code instructions further configure the processor to generate a numerical model of a configuration of the structure based on the first graph of dependencies and second graph of dependencies.

18. The system of claim 10, wherein the computer code instructions further configure the processor to:
update a first numerical model of a configuration of the structure based on the first graph of temporal dependencies and the second graph of temporal dependencies, said updating resulting in a second numerical model; and if the second numerical model is different from the first numerical model, determining that the structure has changed.

19. A non-transitory computer-readable medium configured to store instructions for structural health monitoring (SHM), the instructions, when loaded and executed by a processor, causes the processor to:
sense a plurality of vibration signals at each of a plurality of locations of a structure, each vibration signal sensed by a respective time-synchronized sensor mounted at the respective location on the structure;

generate a first graph of temporal dependencies, each edge of the first graph representing whether the respective vibration signal at a first sample time is probabilistically dependent on the another vibration signal at a second sample time, the second sample time being later than the first sample time;

generate a second graph of temporal dependencies, each edge of the second graph representing whether the respective vibration signal at the second sample time is probabilistically dependent on the another vibration signal at a third sample time, the third sample time being later than the second sample time; and determine whether the structure has changed if the first graph of temporal dependencies is different from the second graph of temporal dependencies.

20. The non-transitory computer-readable medium of claim 19, wherein the instructions further cause the processor to:
update a first numerical model of a configuration of the structure based on the first graph of temporal dependencies and second graph of temporal dependencies, said updating resulting in a second numerical model; and if the second numerical model is different from the first numerical model, determine that the structure has changed.

* * * * *

UNITED STATES PATENT AND TRADEMARK OFFICE
CERTIFICATE OF CORRECTION

PATENT NO. : 10,997,329 B2
APPLICATION NO. : 15/012463
DATED : May 4, 2021
INVENTOR(S) : William T. Freeman et al.

Page 1 of 1

It is certified that error appears in the above-identified patent and that said Letters Patent is hereby corrected as shown below:

In the Claims

In Claim 19, Column 24, Line 36, please delete "the" and add --a-- instead.

In Claim 19, Column 24, Line 38, before "another" please delete "the".

Signed and Sealed this
Twenty-second Day of June, 2021

Drew Hirshfeld
*Performing the Functions and Duties of the*
*Under Secretary of Commerce for Intellectual Property and*
*Director of the United States Patent and Trademark Office*